US006441395B1

(12) United States Patent
Yu et al.

(10) Patent No.: US 6,441,395 B1
(45) Date of Patent: Aug. 27, 2002

(54) COLUMN-ROW ADDRESSABLE ELECTRIC MICROSWITCH ARRAYS AND SENSOR MATRICES EMPLOYING THEM

(75) Inventors: Gang Yu, Santa Barbara; Yong Cao, Goleta, both of CA (US)

(73) Assignee: Uniax Corporation, Santa Barbara, CA (US)

( * ) Notice: Subject to any disclaimer, the term of this patent is extended or adjusted under 35 U.S.C. 154(b) by 0 days.

(21) Appl. No.: 09/241,656

(22) Filed: Feb. 2, 1999

Related U.S. Application Data

(60) Provisional application No. 60/073,411, filed on Feb. 2, 1998.

(51) Int. Cl.$^7$ ............................................. H01L 35/24
(52) U.S. Cl. ......................... 257/40; 257/291; 257/444
(58) Field of Search .......................... 257/40, 291, 292, 257/293, 443, 444

(56) References Cited

U.S. PATENT DOCUMENTS

| | | | | |
|---|---|---|---|---|
| 3,519,999 A | * | 7/1970 | Gregor | 317/258 |
| 3,833,894 A | | 9/1974 | Aviram et al. | |
| 4,665,428 A | * | 5/1987 | Hockley et al. | 357/58 |
| 4,906,855 A | | 3/1990 | Berger et al. | |
| 4,983,533 A | * | 1/1991 | Go | 437/7 |
| 5,164,809 A | | 11/1992 | Street et al. | |
| 5,262,649 A | | 11/1993 | Antonuk et al. | |
| 5,272,359 A | * | 12/1993 | Nagasubramanian et al. | 247/40 |
| 5,327,327 A | * | 7/1994 | Frew et al. | 361/784 |
| 5,454,880 A | * | 10/1995 | Sariciftci et al. | 136/263 |

FOREIGN PATENT DOCUMENTS

| | | |
|---|---|---|
| EP | 0330395 | 8/1989 |
| EP | 0580445 | 1/1994 |
| WO | WO96/31909 | 10/1996 |

OTHER PUBLICATIONS

Yorkston, J. et al., Comparison of Computer Simulations with Measurements from a–Si:H Imaging Arrays, Mat. Res. Soc. Symp. Proc., vol. 258, 1992, 1163–1168.
Street, R.A. Amorphous Silicon Electronics, MRS Bulletin, Nov. 1992, 70–76.
Braun, D. et al., Visible Light Emission from Semiconducting Polymer Diodes, Appl. Phys. Lett. 58(18), May 6,1991, 1982–1984.
Yu, G. et al., Dual–Function Semiconducting Polymer Devices: Light–Emitting and Photodetecting Diodes, Appl. Phys. Lett. 64(12), Mar. 12, 1994, 1540–1542.
Yu, G. et al., High Efficiency Photonic Devices Made With Semiconducting Polymers, Synthetic Materials, 85, 1997 1183–1186.
Parker, I.D., Carrier Tunneling and Device Characteristics in Polymer Light–Emitting Diodes, J. Appl. Phys. 75(3), Feb. 1, 1994, 1656–1666.

* cited by examiner

Primary Examiner—Sara Crane

(57) ABSTRACT

The present invention relates generally to fabricating two-terminal electric microswitches comprising thin semiconductor films and using these microswitches to construct column-row (x-y) addressable microswitch matrices. These microswitches are two terminal devices through which electric current and electric potential (or their derivatives or integrals) can be switched on and off by the magnitude or the polarity of the external bias. The microswitches are made from semiconducting thin films in a electrode/semiconductor/electrode, thin film configuration. Column-row addressable electric microswitch matrices can be made in large areas, with high pixel density. Such matrices can be integrated with a sensor layer with electronic properties which vary in response to external physical conditions (such as photon radiation, temperature, pressure, magnetic field and so on), thereby forming a variety of detector matrices.

33 Claims, 12 Drawing Sheets

COLUMN-ROW ADDRESSABLE ELECTRIC MICROSWITCH ARRAYS AND SENSOR MATRICES EMPLOYING THEM

CROSS-REFERENCE TO RELATED APPLICATIONS

This application claims the benefit of U.S. Provisional Application No. 60/073,411, filed Feb. 2, 1998, which application is incorporated herein by reference in its entirety.

BACKGROUND OF THE INVENTION

1. Field of the Invention

The present invention relates generally to the fabrication of electric microswitches with thin semiconductor films and column-row (x-y) addressable electric switch matrices constructed with such microswitches. These microswitches are two terminal devices through which electric current, electric potential or their derivatives or integrals can be switched on and off by the magnitude or the polarity of an external bias. They are made of semi conducting thin films in metal/semiconductor/metal, thin film configuration. Column-row addressable electric micro-switch matrices can be made to cover large areas, with high pixel density. Such matrices can be integrated with one (or several) additional layer(s) with electronic properties which vary in response to external physical conditions (such as photon radiation, temperature, pressure, x-rays, magnetic field and so on), thereby forming a variety of detector matrices.

2. Brief Description of the Prior Art

Traditional electric switches are electromechanical devices such as relays for large current, high power applications. On the other hand, there is general interest in high pixel density, column-row addressable electric microswitches for various sensor applications. Switches made with discrete mechanical relays are too bulky, too large in size and often too slow in switching speed for this application. Fewer than $10^2$ channels are typically seen in a single control board in the automation control industry.

Complementary metal-oxide-semiconductor (CMOS) technology and field effect transistors have been used to fabricate switching circuits in large scale integrated circuits (LSICs) on semiconductor wafers. Typicall switching circuits are constructed by a series of field effect transistors and are known as active matrix arrays. Such microswitches have been used in fabrication of high pixel density 2D image sensors and memory devices. However, the material and the process costs have limited the use of such active matrix arrays. in large size sensor applications.

The thin film transistor (TFT) technology on glass or quartz substrates, developed originally for the needs of liquid crystal displays (LCDs), provide another example of active-mode (AM) microswitch substrates. In addition to use in AM-LCDs, a large size, full color image sensor made with amorphous silicon (a-Si) p-i-n photocells on a-Si TFT panels was demonstrated recently [J. Yorkston et al., Mat. Res. Soc. Sym. Proc. 116, 258 (1992); R. A. Street, Bulletin of Materials Research Society 11(17), 20 (1992); L. E. Antonuk and R. A. Street, U.S. Pat. No. 5,262,649 (1993); R. A. Street, U.S. Pat. No. 5,164,809 (1992)].

FETs are three-terminal, active devices. Microswitch panels made with such switch units are often called active matrices. The drain current of each FET can be switched on and off by its gate voltage. The on/off ratio is typically in the range of $10^4$–$10^8$.

As demonstrated in this invention, solid state microswitches can also be made from two-terminal, passive devices such as metal/semiconductor Schottky diodes, metal/semiconductor/metal (MSM) devices, p-type semiconductor/n-type semiconductor (p-n) junction devices, or p-type semiconductor/insulator or undoped semiconductor/n-type semiconductor (p-i-n) junction devices. The electric current can be switched on and off by the magnitude or the polarity of an external bias.

This invention discloses large size, high pixel density microswitch matrices comprising passive devices in MSM structure or in structures of its variations. This invention also discloses a method of fabricating such large size, high pixel density microswitch matrices. The semiconductor, which can be either organic or inorganic, is in a thin film configuration. Thin film devices made with inorganic materials (such as selenium, germanium, silicon, Ge—Si alloys, ZuS, CdS or CdSe) have been developed for decades, and have been used in many applications, including for example photovoltaic energy conversion. Organic diodes in the metal-organic-metal MSM thin film structure have also been studied [for reviews of MSM devices made with organic molecules and conjugated polymers, see: James C. W. Chien, Polyacetylene: Chemistry, Physics and Material Science, Chapter 12 (Academic, Orlando, 1978); G. A. Chamberlain, Solar Cells 8, 47 (1983); J. Kanicki, in Handbook of Conducting Polymers, T. A. Skotheim, Ed. (Dekker, N.Y., 1986)]. However, the performance of these early devices (as determined by their I-V characteristics) was insufficient to enable use as electric switches.

With the improvement of both material quality and device fabrication processes, organic MSM devices with rectification ratios of $10^5$–$10^6$ were recently demonstrated [D. Braun and A. J. Heeger, Appl. Phys. Letters 58, 1982 (1991); G. Yu, C. Zhang and A. J. Heeger, Appl. Phys. Lett. 64, 1540 (1994)].

The rectification ratio can be further improved by introducing proper blending processes and by structural variation of the device, such as using a bi-layer semiconducting film or by selecting different metals as contacts to improve the carrier injection [I. Parker, J. Appl. Phys. 75, 1656 (1994)]. Such organic MSM devices can be operated continuously over periods in excess of $10^4$ hours at current densities of 10 mA/cm² [G. Yu, C. Zhang, Y. Yang and A. J. Heeger, Annual Conference of Materials Research Society, San Francisco, April 1995].

As disclosed in this invention, these thin film MSM devices with high recitification ratio can be used for fabricating large area solid state microswitch boards (panels) with high pixel density.

STATEMENT OF THE INVENTION

The present invention discloses electric microswitch devices comprising thin semiconductor films and a methodology for fabricating them. The present invention also discloses a methodology for fabricating column-row (x-y) addressable electric microswitch arrays (matrix panels) with such microswitches as the individual pixel elements. These microswitches are two terminal devices through which electric current, or electric potential (or their derivatives or integrals) can be switched on and off by the magnitude or the polarity of an external bias. They are made of semiconducting thin films in electrode/semiconductor/electrode, thin film configuration. Column-row addressable electric switch matrices can be made in large areas, with high pixel density. Such matrices can be integrated with a sensor layer with electronic properties which vary in response to external physical conditions (such as photon radiation, high energy particle radiation, temperature, surface pressure. magnetic field and so on), thereby forming a variety of detector matrices.

DETAILED DESCRIPTION OF THE INVENTION

The detailed description of this invention includes the following sections: Brief description of the Drawings Description of the Preferred Embodiments

BRIEF DESCRIPTION OF THE DRAWINGS

This invention will be further described with reference being made to the drawings in which.

DESCRIPTION OF PREFERRED EMBODIMENTS

Figure 1:
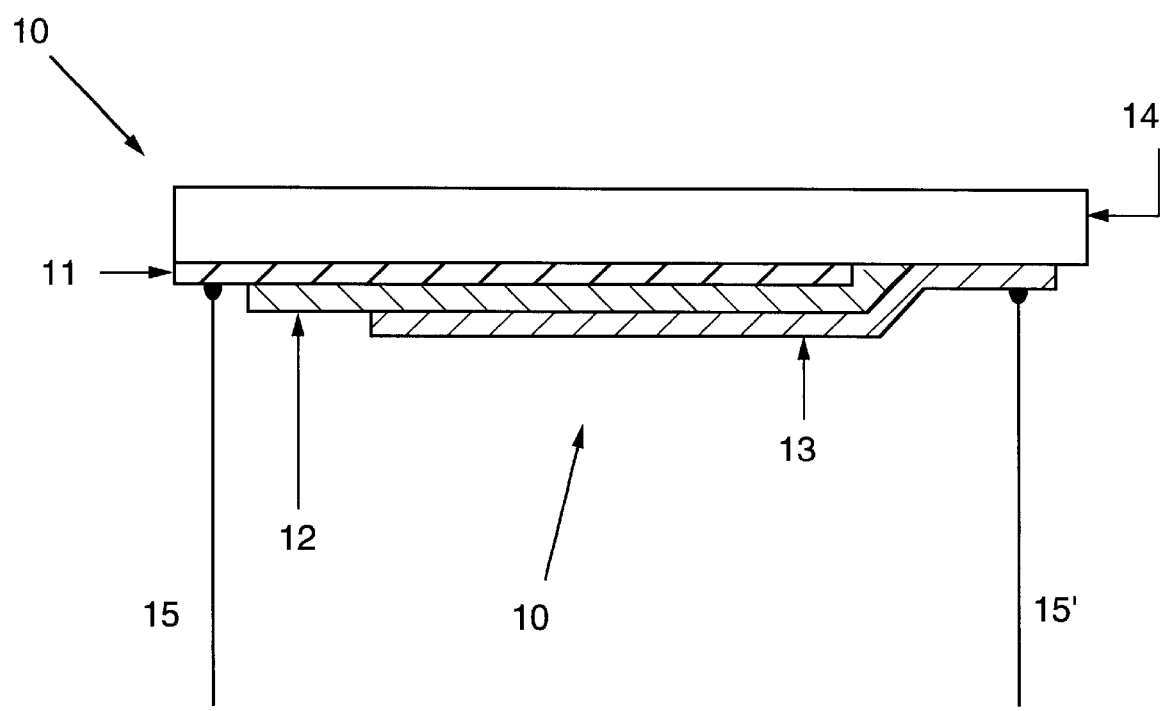
FIG. 1 is a cross-sectional view of a solid state microswitch (10) made with a semiconducting film (12) sandwiched between two conducting electrodes (11, 13) with different or similar work functions.

In this description of preferred embodiments and in the claims, reference will be made to several terms which must be defined. One group of terms concerns the structures of the microswitches and the sensor elements they can control. Cross-sectional views of two embodiments of the microswitches are shown in FIG. 1 and FIG. 2. The switch is constructed using the electrode-semiconductor-electrode thin film device configuration. Specifically, the switch includes:

A semiconducting layer (12) comprising organic or inorganic semiconducting material(s). Examples of organic semiconductors include conjugated polymers, polymer blends, polymer/molecule polyblends, layer of organic molecules, organometallic molecules, or molecular blends (alloys); or a multilayer structure combining the above materials. Examples of inorganic semiconductors include Si, Se, Ge, Si—Ge alloys, CdS, CdSe, $TiO_2$, CuO, etc. Examples of organic semiconductors include polyacetylene (PA) and its derivatives, polythiophene (PT) and its derivatives, poly(p-phenyl vinylene) (PPV) and its derivatives such as MEH-PPV, fullerene molecules such as $C_{60}$ and its derivatives, bucky tubes, anthracene, tetracene, pentacene, $Alq_3$ and other metal-chelate (M-$L_3$) type organometallic molecules and so on. The layer 12 can also be a composite comprising organic and inorganic materials or in the form of bi-layer or multiple-layers of such materials.

The layer 12 can be a semiconductor doped with one or more dopants. Extra charges are commonly results from dopants with different valance electrons. A doped semiconductor with electrons as majority charge carriers is called n-type semiconductor and a doped semiconductor with holes as majority carries is called p-type semiconductor. The doping levels in the layer 12 can distribute inhomogeneously and can change sign from p-type to n-type (which forms a p-n junction inside 12) or from p-type to undoped region then to n-doped region (which forms a p-i-n junction inside 12).

Two "contact electrodes" (layers 11, 13) which serve as the anode and cathode of the switches to extract electrons and holes, respectively, from the semiconductor layer. In some embodiments at least one of the electrodes (e.g., layer 11 in FIG. 1) is made transparent or semitransparent. These electrodes are described in more detail below.

The anode electrode is defined as a conducting material with higher work function than the cathode material.

Figure 2A:
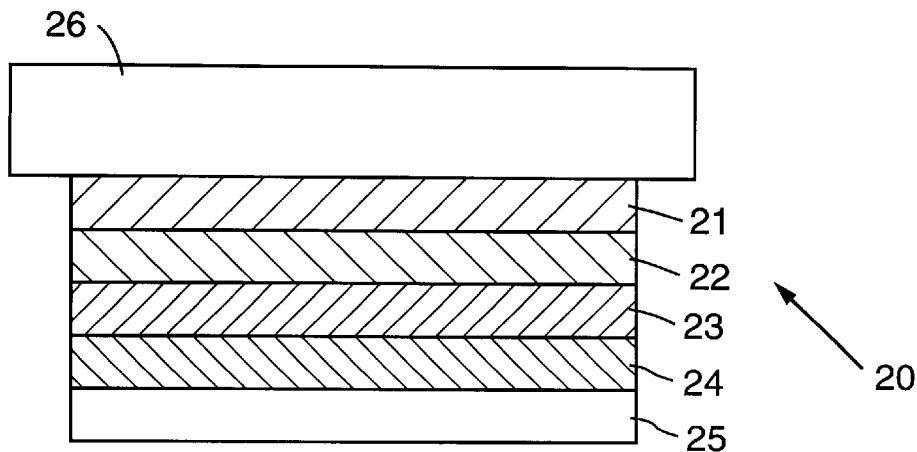
FIG. 2A is a cross-sectional view of a switchable two-terminal sensing element (20) comprising a microswitch and a sensing device with electrical properties (such as conductivity, potential difference) which vary in response to external environment conditions.

The devices may also include an optional substrate or support 26, as shown in FIG. 2A. This is a solid, rigid or flexible layer designed to provide robustness to the switches and/or to the matrix array of switches. In some embodiments the substrate is transparent or semitransparent at the wavelengths of operation. Glass quartz, polymer sheets, or flexible plastic films are commonly used substrates. Wide band semiconductor wafers (such as SiC, SiN) can also be used in some applications. In these cases, a thin, doped region can also serve as the contact electrode 21.

Figure 2B:
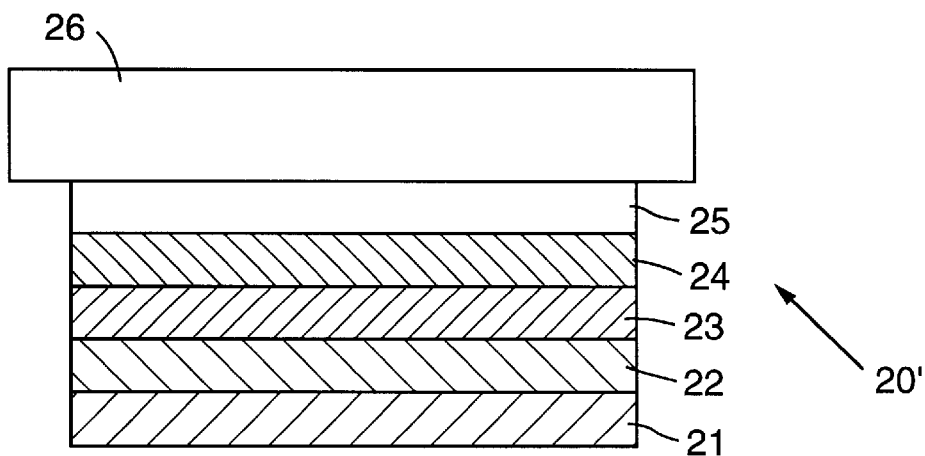
FIG. 2B is a cross-sectional view of an alternative structure to that of FIG. 2A in which the sensor layer 24 is arranged closer to the substrate (26)

Devices with the "inverted" geometry shown in FIG. 2B are also useful In this configuration, light is incident through the electrode 21 in contact with the free surface; thus, optically opaque materials can be used as substrates. For example, by using an inorganic semiconductor wafer (such as silicon) as the substrate 26, and by doping the semiconductor to "conductive" levels (as defined in the following), the wafer can serve both as the substrate 26 and the contact electrode 25 circuitry built directly onto the inorganic semiconductor substrate (using integrated circuit technology).

Incident light is defined generally to include wavelengths in visible (400–700 nm), wavelengths in the ultraviolet (200–400 nm), wavelengths in vacuum ultraviolet (<200 nm), and wavelengths in the near infrared (700–2500 nm).

Several layers are designated as transparent or semitransparent. These terms are used to refer to the property of a material which transmits a substantial portion of the incident light incident on it. The term "transparent" is often used to describe a substrate with transmittance over 20% and the term "semitransparent" is often used to describe a substrate or layer with transmittance between 20% and 1%.

A "conductive" layer or material has a conductivity typically larger than 0.1 S/cm. A semiconducting material has conductivity of from $10^{-14}$ to $10^{-1}$ S/cm.

A 'dielectric' or an 'insulating' layer of material has a conductivity typically lower than $10^{-10}$ S/cm.

The "positive" (or "negative") bias refers to situations where a higher potential is applied to the anode electrode (cathode electrode). When values of negative voltage are referred to, as in the case of the reverse bias voltages applied to obtain enhanced photosensitivity, the relative values will be stated in terms of absolute values; that is, for example, a –10 V (reverse) bias is greater than a –5 V (reverse) bias.

The spectral response of optical image sensing elements which one often coupled to its switches is determined by the optical band gap and the electronic properties (such as carrier mobility) of the sensing material, by the structure of the sensing elements and by the transmission characteristics of the optical filters, substrates, or other coating layers in the optical path; as demonstrated in the examples in this application.

In addition to single band, visible image detection (often referred as black/white, or monochromatic image sensors), there is great demand for image sensors with full-color detectivity. Full-color detection is often achieved by splitting the visible spectrum into three separate regions, the red (600–700 nm), green (500–600 nm) and blue (400–500 nm) fundamental colors. A full-color signal can be represented by the intensities of the incident light in these three bands. A full-color image element thus refers to an image device with three spectral channels in the red, green and blue spectral ranges (sometimes, their complimentary colors, cyan, magenta and yellow, are chosen), and can provide correct color and light intensity information on the incident light.

A coating of "black" material (opaque in the spectral range of interest) in the area between each sensing pixel can be placed in front of the photodetector plane, forming a "black matrix". This coating is helpful in some situations to further reduce cross-talk between neighbor pixels in devices with an unpatterned photoactive organic layer. Black matrices have been used in CRT monitors and other flat panel displays to increase display contrast, and are well known in the display industry. The patterning of the "black matrix" can be achieved with standard photolithography, stamp, ink-jet or screen printing techniques.

Electrodes

In the configuration shown in FIG. 1, a transparent substrate and a transparent electrode are used as one contact electrode. Indium-tin-oxides ("ITO") can be used as the electrode. Other transparent electrode materials include aluminum doped zinc oxides ("AZO"), aluminum doped tin-oxides ("ATO"), tin-oxides and the like. These conducting coatings are made of doped metal-oxide compounds which are transparent from near UV to mid-infrared.

The electrode can also be made with other doped inorganic compounds or alloys. These compounds can be doped into metallic (or near metallic) form by varying the composition of the elements involved, the valance of the elements or the morphology of the films. These semiconducting or metallic compounds are known in the art and are well documented (e.g., N. F. Mott, Metal-Insulating Transitions, 2nd edition (Taylor & Francis, London, 1990); N. F. Mott and E. A. Davis, Electronic Processes in Non-crystalline Materials (Claredon, Oxford, 1979)]. Examples of such compounds include the cuprate materials which possess superconductivity at low temperatures (so-called high temperature superconductors).

This electrode can be formed of a conductive polymer such as polyaniline in the emeraldine salt form prepared using the counterion-induced processability technology disclosed in U.S. Pat. No. 5,232,631 and in Appl. Phys. Lett. 60, 2711 (1992) or other suitable techniques. The polyaniline film which serves as the electrode can be cast from solution with high uniformity at room temperature. The organic conducting electrodes in combination with polymer substrates and organic active layers allow these photosensors to be fabricated in fully flexible form. Other conductive polymers can be used for the transparent or semitransparent electrode (11 in FIG. 1 or 21 in FIG. 2A) include polyethylene dioxythiophene polystyrene sulfonate, ("PEDT/PSS") [Y. Cao, G. Yu, C. Zhang, R. Menon and A. J. Heeger, Synth. Metals, 87, 171 (1997)], poly(pyrrole) or its function derivatives doped with dodecylbenzene sulfonic acid ("DBSA") or other acid [J. Gao, A. J. Heeger, J. Y. Lee and C. Y. Kim, Synth. Metals 82, 221 (1996)] and the like.

A thin semitransparent layer of metals (such as Au, Ag, Al, In etc.) can also be used as electrodes. Typical thicknesses for this semitransparent metal electrode are in the range of 50–1000 Å, with optical transmittance between 80% and 1%. A proper dielectric coating (often in the form of multilayer dielectric stacks) can enhance the transparency in the spectral range of interest [For examples, see S. M. Sze, Physics of Semiconductor Devices (John Wiley & Sons, N.Y., 1981) Chapter 13].

A transparent electrode can also be made from metal/conducting polymer, conducting polymer/metal/conducting polymer or dielectric layer/metal/conducting polymer structures. The transmission properties of these composite electrodes are improved relative to that of a single metal layer of the same thickness.

A metal layer with low optical transmittance can also be used as the electrode for some applications in which spectral response at certain wavelengths is of interest. The photosensitivity can be enhanced by fabricating the device in a micro-cavity structure where the two metal electrodes 11 and 13 act also as optical mirrors. Light resonance between the two electrodes enhances the photosensitivity at certain wavelengths and results in selective spectral response, similar to that seen in optical microcavity (optical etalon) devices.

The "back" electrode 13 in FIG. 1 is typically made of a metal, such as Ca, Sm, Y, Mg, Al, In, Cu, Ag, Au and so on. Metal alloys can also be used as the electrode materials. These metal electrodes can be fabricated by, for example, thermal evaporation, electron beam evaporation, sputtering, chemical vapor deposition, melting process or other technologies. The thickness of the electrode 13 in FIG. 1 (and 11 in FIG. 2) is not critical and can be from hundreds of Å Angstroms to hundreds of microns or thicker. The thickness can be controlled to achieve a desired surface conductivity.

When desired, for example, for a photodiode with detectivity on both front and back side, the transparent and semi-transparent materials described above can also be used as the "back" electrode.

As demonstrated in the examples of this invention, microswitches with useful I-V characteristics can be fabricated using contact layers with relatively high resistivity. For example, PANI-PAAMPSA with a bulk resistivity of order $10^5$ $\Omega$-cm can be used as the anode material of microswitches with good switching I-V characteristics. For example, in a microswitch fabricated in the structure of Mg/MEH-PPV/PANI-PAAMPSA/Ag, the I-V characteristics are defined by the work functions of PANI-PAAMPSA and Mg. Ag serves only a conductor in the test circuit. The advantage of using a contact electrode with high bulk resistivity is that when the lateral resistance is high enough (by proper selection of the bulk resistivity, the thickness of the high resistive anode material and the dimension of the pixels), the cross-talk between pixels becomes sufficiently small that patterning of the high bulk resistivity material is not necessary.

Two "contact electrodes" (11, 13) serve as the anode and cathode of the diodes to inject electrons and holes, respectively. into the semiconducting layer (12). In the devices with undoped semiconductor as layer 12, the anode electrode is defined as the one with relatively higher work function. In the devices with p-n or p-i-n junction in the layer 12, the anode electrode is defined as the one in contact with the p-doped region. In all the cases, the anode can be defined as the electrode with higher potential when the device is in the conductive mode. In addition to traditional metals and alloys, doped semiconductors (both organic and inorganic) can also be used as the contact materials of 11 and 13. An example of using doped silicon as the anode of organic luminescent device has been given by I. D. Parker and H. Kim, Appl. Phys. Letters 64, 1774 (1994). Examples demonstrating the utility of conducting polymers such as polyaniline-(camphor sulfonic acid), PANI-CSA, PEDT-PSS, and polypyrrole, PPy, as electrodes in electroluminescent devices have been disclosed in a number of patents and publications [Y. Cao et al., U.S. Pat. No. 5,232,631; G. Gustafsson, Y. Cao, G. M. Treacy, F. Klavetter, N. Colaneri and A. J. Heeger, Science 357, 477 (1992); Y. Yang, U.S. Pat. No. 5,723,873; G. Heywang and F. Jonas, Adv. MaLerials 4, 116 (1992); Y. Cao, G. Yu, C. Zhang, R. Menon and A. J. Heeger, Synth. Metal (1997); J. Gao, A. J. Heeger, J. Y. Lee and C. Y. Kim, Synth. Metals 82, 221 (1996)].

The Semiconductor Layer

The semiconductor layer is made of a thin sheet of inorganic or organic semiconducting material. Inorganic materials include Si, Se, Ge, CdS, CdSe, TaO, Cuo, etc. The semiconductor layer can comprise one or more semiconducting, conjugated polymers, alone or in combination with non-conjugated materials, one or more organic molecules, or oligomers. The semiconducting materials also serve as active layers in the sensor devices to which these switches may be completed. The active organic layer can be a blend of two or more conjugated polymers with similar or different electron affinities and different electronic energy gaps. The active layer can be a blend of two or more organic molecules with similar or different electron affinities and different electronic energy gaps. The active layer can be a blend of conjugated polymers and orgarnic molecules with similar or different electron affinities and different energy gaps. The latter offers specific advantages in that the different electron affinities; of the components can lead to photoinduced charge transfer and charge separation; a phenomenon which enhances the photosensitivity [N. S. Sariciftci and A. J. Heeger, U.S. Pat. No 5,333,183 (Jul. 19, 1994); N. S. Sariciftci and A. J. Heeger, U.S. Pat. No. 5,454,880 (Oct. 3, 1995); N. S. Sariciftci, L. Smilowitz, A. J. Heeger and F. Wudi, Science 258, 1474 (1992); L. Smilowitz, N. S. Sariciftci., R. Wu, C. Gettinger, A. J. Heeger and F. Wudl, Phys. Rev. B 47, 13835 (1993); N. S. Sariciftci and A. J. Heeger, Intern. J. Mod. Phys. B 8, 237 (1994)]. The active layer can also be a series of heterojunctions utilizing layers of organic materials or blends as indicated above.

The thin films of organic molecules, oligomers and molecular blends can be fabricated with thermal evaporation, chemical vapor deposition (CVD) and so on.

Thin films of conjugated polymers, polymer/polymer blends, polymer/oligomer and polymer/molecule blends can often be fabricated by casting directly from solution in common solvents or using similar fluid phase processing. When polymers or polyblends are used as the active layer, the devices can be fabricated onto flexible substrates yielding unique, mechanically flexible photosensors.

Examples of typical semiconducting conjugated polymers include, but are not limited to, polyacetylene, ("PA"), and its derivatives; polyisothianaphene and its derivatives; polythiophene, ("PT"), and its derivatives; polypyrrole, ("PPr"), and its derivatives; poly(2,5-thienylenevinylene), ("PTV"), and its derivatives; poly(p-phenylene), ("PPP"), and its derivatives; polyflourene, ("PF"), and its derivatives; poly(phenylene vinylene), ("PPV"), and its derivatives; polycarbazole and its derivatives; poly(1,6-heptadiyne); polyisothiariaphene and its derivatives; polyquinolene and semiconducting polyanilines (i.e. leucoemeraldine and/or the emeraldine base form). Representative polyaniline materials are described in U.S. Pat. No. 5,196,144 which is incorporated herein by reference. Of these materials, those which exhibit solubility in organic solvents are preferred because of their processing advantages.

Examples of PPV derivatives which are soluble to common organic solvents include poly(2-methoxy-5-(2'-ethyl-hexyloxy)-1,4-phenylene vinylene), ("MEH-PPV") (F. Wudl, P.-M. Allemand, G. Srdanov, Z. Ni and D. McBranch, in Materials for Nonlinear Optics: Chemical Perspectives, edited by S. R. Marder, J. E. Sohn and G. D. Stucky (The American Chemical Society, Washington D.C., 1991 ) p. 683.], poly(2-butyl-5-(2-ethyl-hexyl)-1,4-phenylenevinylene), ("BuEH-PPV") [M.A. Andersson, G. Yu, A. J. Heeger, Synth. Metals 85, 1275 (1997)], poly(2, 5-bis(cholestanoxy)-1,4-phenylenevinylene), ("BCHA-PPV") [see U.S. patent application Ser. No. 07/800,555, incorporated herein by reference] and the like. Examples of soluble PTs include poly(3-alkylthiophenes), ("P3 AT"), wherein the alkyl side chains contain more than 4 carbons, such as from 5 to 30 carbons.

Organic image sensors can be fabricated using donor/acceptor polyblends as the photoactive layer. These polyblends can be blends of semiconducting polymer/polymer, or blends of semiconducting polymer with suitable organic molecules and/or organometallic molecules. Examples for the donor of the donor/acceptor polyblends include but are not limited to the conjugated polymers just mentioned, that is PPV, PT, PTV, and poly(phenylene), and their soluble derivatives. Examples for the acceptors of the donor/acceptor polyblends include but are not limited to poly (cyanaophenylenevinylene) ("CN-PPV"), fullerene molecules such as $C_{60}$ and its functional derivatives, and organic molecules and organometallic molecules used heretofore in the art for photoreceptors or electron transport layers.

One can also produce photoactive layers using two semiconducting organic layers in a donor/acceptor heterojunction (i.e. bilayer) structure or alternation layer structures. In these structures, the donor layer is typically a conjugated polymer layer and the acceptor layer is made up of poly (cyanaophenylenevinylene) ("CN-PPV"), fullerene molecules such as $C_{60}$ and its functional derivatives (such as PCBM and PCBCR), or organic molecules used heretofore in the art for photoreceptors and electron transport layers. Examples of this heterojunction layer structure for a photoactive layer include but are not limited to, PPV/$C_{60}$, MEH-PPV/$C_{60}$, PT/$C_{60}$, P3AT/$C_{60}$, PTV/$C_{60}$ and so on.

The active layer can also be made of wide band polymers such as poly-N-vinylcarbazole ("PVK") doped with dye molecul e(s) to enhance the photosensitivity in visible spectral range. In these cases, the wide band organic serves as both host binder as well as hole (or electron) transport material. Examples include, but are not limited to, PVK/o-chloranil, PVK/rhodamine B and PVK/coronene and the like.

The photoactive layer can employ organic molecules, oligomers or molecular blends. In this embodiment, the photosensitive material can be fabricated into thin films by chemical vapor deposition, molecular epitaxy or other known film-deposition technologies. Examples of suitable materials include but are not limited to anthracene, phthalocyanine, 6-thiophene ("6T"), 6-phenyl ("6P"), Aluminum chelate (Alq3) and other metal-chelate molecules (m-q3), PBD, spiro-PBD, oxadiazole and its derivatives or molecular blends such as 6T/$C_{60}$, 6T/pinacyanol, phthalocyanine/o-chloranil, 6P/Alq3, 6P/PBD and the like.

Examples of organic molecules, oligomers and molecular blends can be used for the active layer include anthracene and its derivatives, tetracene and its derivatives, phthalocyanine and its derivatives, pinacyanol and its derivatives, fullerene ("$C_{60}$") and its derivatives, thiophene oligomers (such as sixethiophene "6T" and octithiophene "8T") and their derivatives and the like, phenyl oligomers (such as sixephenyl "6P" or octiphenyl "8P") and their derivatives and the like, 6T/$C_{60}$, 6P/$C_6$, 6P/Alq3, 6T/pinacyanol, phthalocyanine/o-chloranil, anthracene/$C_{60}$, anthracene/o-chloranil and the like. For the photoactive layer containing more than two types of molecules, the organic layer can be in a blend form, in bilayer form or in multiple alternate layer forms.

In some embodiments, the active layer 12 comprises one or more organic additives (which are optically non-active) to modify and to improve the device performance. Examples of the additive molecules include anionic surfactants such as ether sulfates with a common structure,

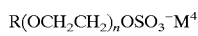

$R(OCH_2CH_2)_nOSO_3^- M^+$ wherein R represents alkyl alkyllaryl, $M^-$ represents proton, metal or ammonium counterion, n is moles of ethylene oxide typically n=2–40).

Application of such anionic surfactants as additives for improving the performance of polymer light-emitting diodes his been demonstrated by Y. Cao [U.S. Patent Application, Ser. No. 08/888,316, which is incorporated by reference].

Other types of additives include solid state electrolytes or organic salts. Examples include poly(ethylene oxide), lithium trifluoromethanesulfonate, or their blends, tetrabutylammonium dodecylbenzenesulfonate and the like. Application of such electrolyte to luminescent polymers and invention of new type of light-emitting devices have been demonstrated in U.S. Pat. Nos. 5,682,043 and 5,677,546.

In cases where the active layer is made of organic blends with two or more phases with different electron affinities and optical energy gaps, nanoscale phase separation commonly occurs, and heterojunctions form at the interfacial area. The phase(s) with higher electron affinity acts as an electron acceptor(s) while the phases with lower electron affinity (or lower ionization energy serves as an electron donor(s). These organic blends form a class of charge-transfer materials, and enable the photo-initiated charge separation process defined by the following steps [N. S. Sariciftci and A. J. Heeger, Intern. J. Mod. Phys. B 8, 237 (1994)]:

Step 1: $D+A \to {}^{1,3}D^*+A$, (excitation on D);

Step 2: ${}^{1,3}D^*+A \to {}^{1,3}(D\text{—}A)^*$, (excitation delocalized on D-A complex);

Step 3: ${}^{1,3}(D\text{—}A)^* \to {}^{1,3}(D^+\text{—}A^{d-})^*$, (charge transfer initiated);

Step 4: ${}^{1,3}(D^{d+}\text{—}A^{d-})^* \to {}^{1,3}(D^{\overset{\circ}{+}}\text{—}A^{\overset{\circ}{-}})$, (ion radical pair formed);

Step 5: ${}^{1,3}(D^{\overset{\circ}{+}}\text{—}A^{\overset{\circ}{-}}) \to D^{\overset{\circ}{+}}+A^{\overset{\circ}{-}}$, (charge separation)

where (D) denotes the organic donor and (A) denotes the organic acceptor; 1,3 denote singlet or triplet excited states, respectively.

Typical thickness of the active layer range from a few hundred Angstrom units to a few thousand Angstrom units; i.e., 100–5000 Å(1 Angstrom unit=$10^{-8}$ cm). Although the active film thicknesses are not critical, device performance can typically be improved by using thinner films with optical densities of less than two in the spectral region of interest.

The microswitch (10) may also include an optional substrate or support 14, as shown in FIG. 1. This is a solid, rigid or flexible layer designed to provide robustness to the diodes and/or to a matrix array of diodes. Glass, quartz, polymer sheets or flexible plastic films are substrates commonly used. Semiconductor wafers (such as Si. GaAs, SiC, SiN) can also be used as the substrate 14. In these cases, a thin, doped region of the substrate can also serve as the contact electrode 11.

The current-voltage (I-V) characteristic; of the devices shown in FIG. 1 are typically asymmetric. As demonstrated in the Examples, the rectification ratio (defined as the ratio of forward current to reverse current at a given bias magnitude) can be as high as $10^6$–$10^7$; i.e., conductive in the forward bias direction and insulating at zero and in reverse bias. Devices with two terminals, such as that of FIG. 1, and with strong asymmetry in I-V characteristics are traditionally called diodes (passive devices) and are represented by a symbol →, in which the arrow denotes the direction of current flow. The switching property can be characterized by the rectification ratio I(V)/I(-V), or the switching ratio (a current ratio at two given voltages $I(V_1)/I(V_2)$ in which $I(V_1)>I(V_2)$). A special situation is $V_2=0$. As demonstrated in the Examples of this invention, the switching ratio $I(V_1)/I(V_2)$ can be higher than $10^{10}$ for $V_2$ close to 0V.

Figure 2C:
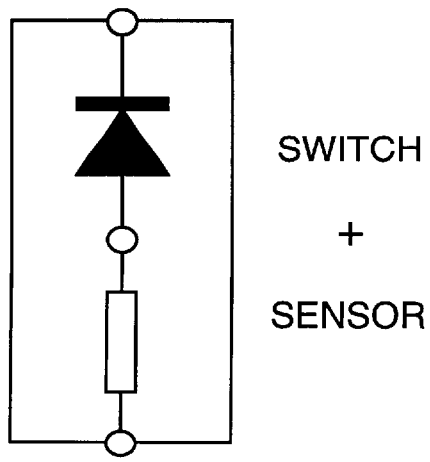
FIG. 2C is a schematic diagram of the equivalent circuit of FIG. 2A and FIG. 2B.

The MSM device (10) shown in FIG. 1 can be used as an electric switch to switch on and off a sensor device in series with the switch, forming a voltage switchable sensor unit. Two geometric structures of the sensor unit 20 are shown in FIGS. 2A and 2B. This unit 20 includes substrate 26, a sensor made up of electrodes 25 and 23 and sensing element 24. The switching function is provided by electrodes 21 and 23 and semiconductor layer 22. FIG. 2C shows their equivalent circuit. Since the conductivity or electric potential (or time derivatives or integrals) of the sensor layer are designed to change in response to external physical conditions (for example, temperature or magnetic field), this sensing circuit can be used as a sensing element which can be switched on in forward bias and be switched off at zero and reverse bias.

Many physical effects can be detected by selecting the sensing layer. For example, the resistivity of the sensing layer can change directly in response to changes in the temperature, magnetic field (magnetoresistivity or Hall effect), incident light intensity, incident microwave radiation strength or in response to X-ray or other high energy fluxes (photoconductive effect) and so on. Alternatively, external environmental changes results in a built-in electric potential in the sensing layer, which in turn leads to the forward current change in the circuit unit shown in FIG. 2C. Examples include the piezoelectric effect (voltage change in response to pressure change), the thermoelectric effect (voltage change in response to temperature change), and the photovoltaic effect (voltage change in response to change in incident light intensity), etc. The sensing element (24) shown in FIG. 2 can also be used for another type of sensing applications, in which the derivative and integral of the current vary in response to changes in the external environment. As demonstrated in Example 7, the MSM micr() switches shown in FIG. 1 also exhibit switching characteristics on dI/dV, the integral of I(V), and time derivative and integral of the device current.

When the sensor (20) is used for light wave or radio wave detection, one of the electrodes (25, 21) should be transparent or semitransparent to the incident electromagnetic wave. When the wave is incident from the substrate side, the substrate needs to be transparent or semitransparent to the incident wave as well.

Figure 3A:
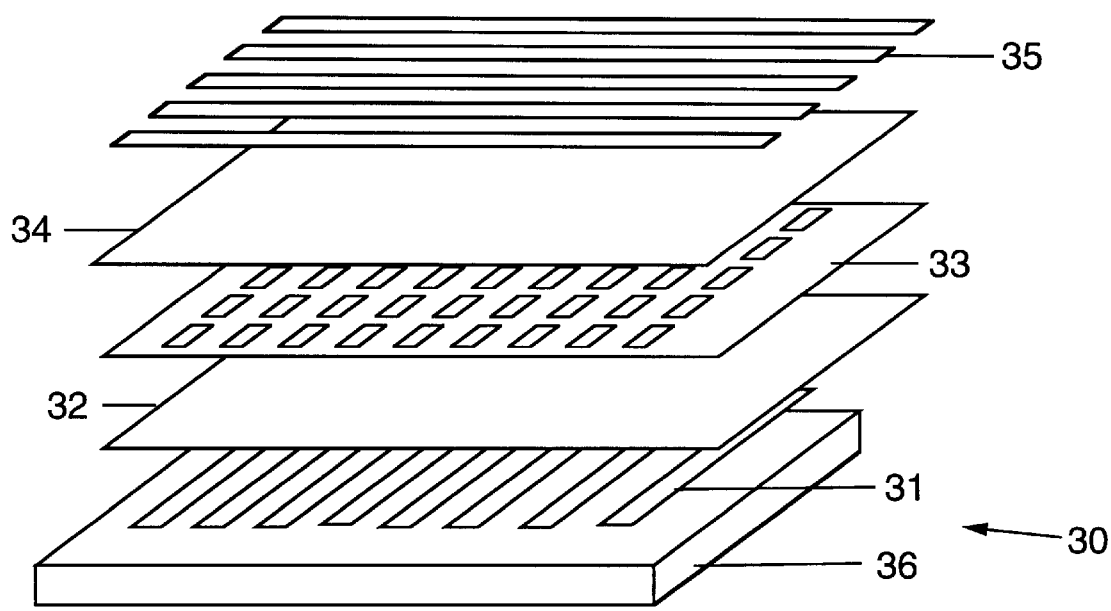
FIG. 3A shows the structure of a column-row addressable sensor matrix (30) constructed by an array of row electrodes (35) and an array of column electrodes (31); at each junction between a column and a row electrode is a switchable sensing element similar to that shown in FIG. 2.

Column-row addressable, two-dimensional (2D), passive sensor matrices can be constructed with the voltage-switchable sensor elements, as shown in FIG. 2. Two matrix structures are shown in FIG. 3. Their equivalent circuits (in 8 row, 14 column form) are shown in FIG. 4. In these sensor matrices, the electrodes (31, 35) are typically patterned into rows and columns perpendicular to each other. In the case of FIG. 3A, an array of the column electrodes (31) is first deposited and patterned on the substrate (36). Then, a sensor layer (32) is deposited or cast. When the lateral conduction of the sensor layer between the pixels is sufficiently low, this layer does not have to be patterned. The n a metal layer or a doped semiconductor layer (33) is deposited (and patterned, if necessary); (33) serves as the second electrode for each of the sensors, and it serves as the contact electrode to the switching diodes. As specifically noted, conducting polymers and other doped semiconductors with proper work function can be used for layer 33. When the lateral resistance of the material comprising layer 33 is high enough, the crosstalk between neighboring pixels is negligible. In such cases, 33 need not be patterned, a simplification which leads to considerable advantage in manufacturing cost and reliability. The switching layer (34) is then deposited. Finally, the array of the column electrodes (35) is fabricated on top of the sensing layer to complete the column-row addressable sensor array.

Patterning of the semiconductor layers (32, 34) is not necessary when the lateral resistance of the material comprising that layer is high enough. Thus, continuous sheets can be used for the sensor matrix. Each cross-point of the row and column electrodes defines a sensing element (pixel) with device structure similar to that shown in FIG. 1 or FIG. 2. The row and the column electrodes also serve as the contact electrodes for the microswitches and the sensing devices. The electrode 33 can be either a single-layer or a bi-layer, to meet the contact needs for both switching layer 32 and sensing layer 34. When highly conductive metals are used for 33, this layer needs to be patterned into isolated pixels as that shown in FIG. 3. However, a thin layer of metal can be prepared as the electrode 33 in the form of granular particles with a density below percolation threshold, the resistance in lateral direction is large enough that no patterning of the electrode 33 is necessary. As shown in Example 11, such a thin, discontinuous metal film still provides the work function needed for the switching devices.

When doped semiconductor layers with relatively high lateral resistivity are used for 33, patterning of 33 can be avoided for certain applications, and a thin continuous coating can be used. The active area of each pixel is defined either by the widths of the row and column electrodes (31, 35), or defined by the patterned size of electrode 33, whichever is smaller.

Figure 3B:
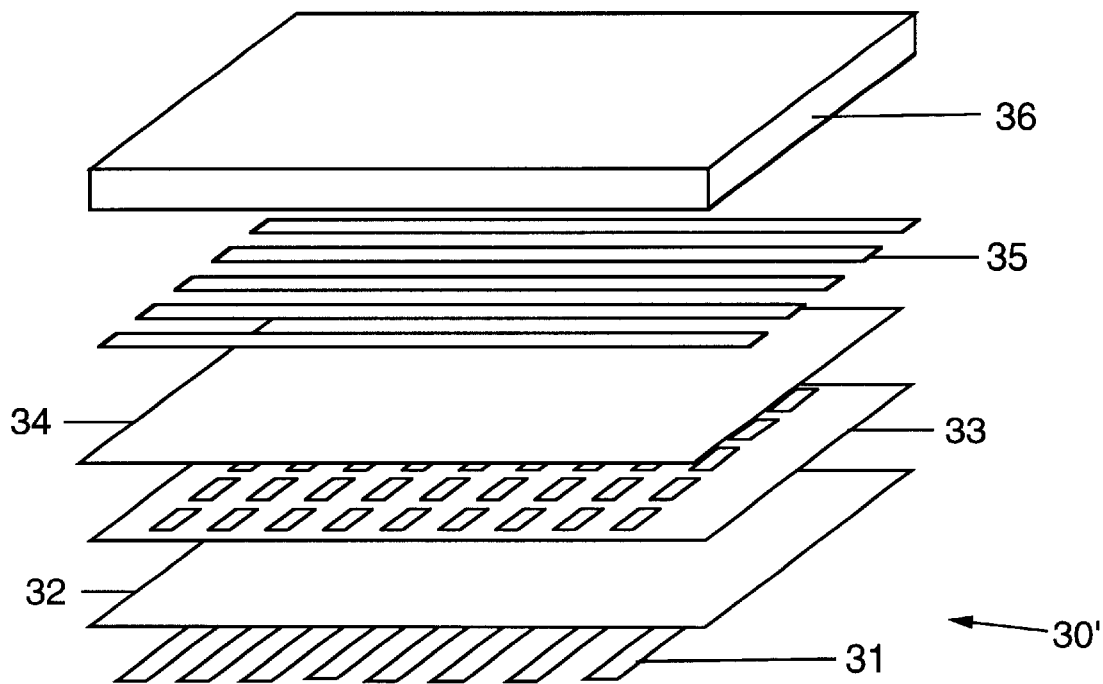
FIG. 3B shows the reverse structure to that of FIG. 3A.
Figure 4:
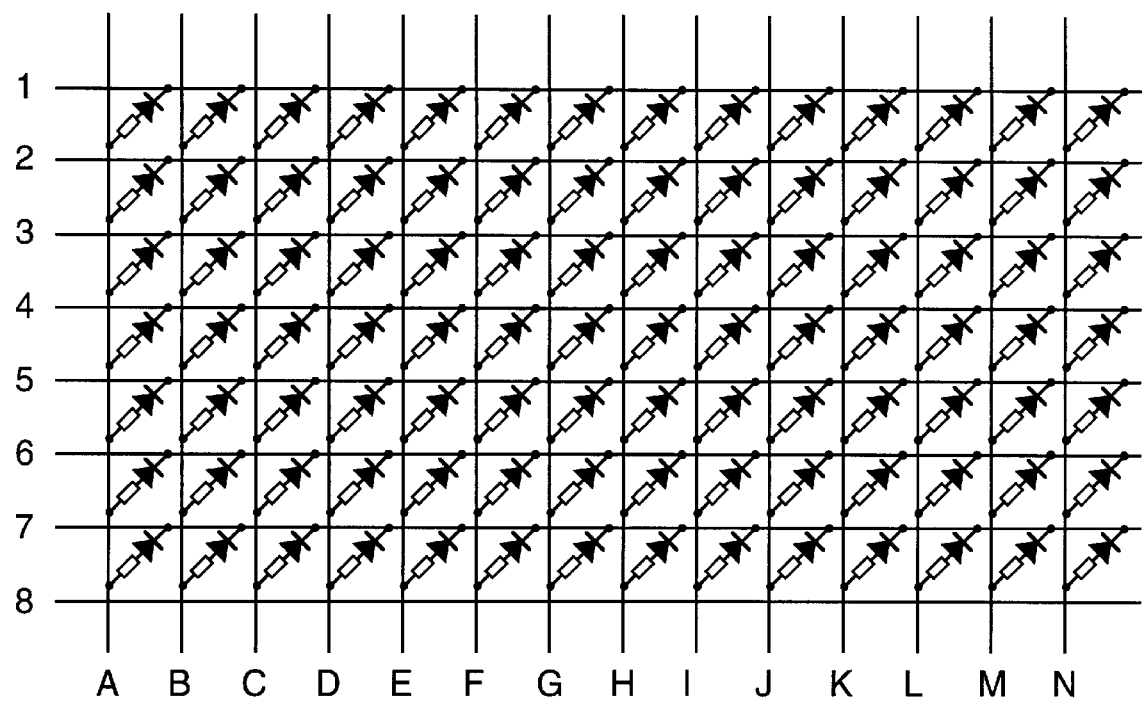
FIG. 4 shows the equivalent circuit of an 8×14 sensor matrix.

The device structure can be reversed so that the switching layer is closer to the substrate, as shown in FIG. 3B. The preference is dependent on the process simplicity or the type of sensor fabricated. For example, for a pressure sensor which senses the mechanical pressure near the device pixels, FIG. 3B is the better choice since the sensor layer is closer to the free surface. For an IR sensor in which an inorganic semiconductor layer (e.g., Ge) is used for IR sensing, the structure of FIG. 3A is favored, since the metal layer (33) can be patterned with conventional photolithography technology on top of the IR sensor (Ge) layer.

The common electrode 33 provides the work function necessary for the switching diodes. Since high resistivity polymers (such as PANI) and doped inorganic semiconductors can provide this function, such materials can be used as the common electrode between the sensing layer and the switching layer. In some applications, patterning of the common electrode layer can also be eliminated.

These microswitch-based passive sensor matrices can be operated and addressed using schemes similar to those developed for light emitting diode matrices. One practical driving scheme is to apply a positive bias across the row and column electrode selected (for example, between row electrode 2 and column electrode B in FIG. 4), leaving the rest floating. This is often achieved with analog multiplexers connected to the row and column e lectrodes. The pixel at the cross-point of the two electrode is then switched on with an applied forward bias larger than the turn-on voltage. Since there is always a diode in reverse bias in the parallel paths seen from 2 to B (except the path at the cross-point), the leakage currents from the parallel paths are negligible. Thus, pixel 2B is selected. The current or its integral (charge) or derivative tested in the external test loop connecting 2B is thus sensitive to the physical condition near the pixel 2B. The image of the entire sensor can be electronically recorded by selecting each pixel of the array in time sequence.

Another driving scheme is achieved by connecting the row and the column electrodes to digital gates which provide only two possible voltage states, "high" and "low". This is often accomplished via digital decoder circuits or digital shift registers. In this driving scheme, three biasing conditions at V+, 0V and V− exist for each sensing pixel. For example, if at an instant of time, row 2 is selected low and column B is selected high, then pixel 2B is under forward bias and is selected. The remainder of the pixels in the row 2 can be actively turned off by applying the same potential as that of 2 to all the columns except B. These pixels are thus under zero bias. The remaining pixels in the column B can also be actively turned off by applying the same potential as that of column B to all rows except 2. In this way, all the pixels except 2B will be subject to either zero bias or reverse bias, and therefore will not contribute to the current in the external circuit. For the pixels under zero bias, an even larger switching ratio, $I(V_{on})/I(0V)$ is achieved than that given by the rectification ratio $I(V_{on})/I(-V_{on})$.

Another driving scheme is achieved by fixing all the row(or column) electrodes at a given potential (such as at 0V) for read out (such as connected to current-voltage converters or current integraters). The column(or row) electrodes are scanned one-by-one between the same potential applied to the row(column) electrodes and the potential corresponding to $V_{on}$. This operation can be realized by a digital shift register or with a digital decoder. In this driving scheme, a column(row) is switched on at a given time, leaving the rest columns(rows) under zero bias. The microswitches connected to the off columns(rows)are thus in the off state. As shown in the Examples, the current switching ratio $I(V_{on})/I(0V)$ can be over $10^9$ times, better than the rectification ratio $I(V_{on})/I(-V_{on})$ Since the data are read out column(row) by column(row), the time need for read out the entire matrix can be much faster than that with the point scan schemes.

There are two common approaches to column and row selections. One is the so-called shift-registration, in which the pixels are scanned line-by-line in time sequence. This addressing method has been frequently used in emissive displays made with passive light emitting diodes and in CCD cameras. The other addressing scheme is the so-called "random addressing", in which the row and column electrodes are encoded and are selectable with a binary decoding circuit. This addressing scheme has frequently been used in memory chips in the computer industry. This scan scheme is interested by its selectability of sensing area with faster frame time. Both addressing schemes can be used to address the microswitch boards and the integrated sensor matrices shown in FIGS. 3 and 4.

The switch matrices disclosed in this invention can be used not only for sensor applications (picking up signals from each pixel location), but also for delivering electric signals (current, charge, voltage and their variations) to every pixel locations. Corporating such microswitches with a dielectric layer with electric memory property, readable and writable momory devices can be constructed. Corporating such a switch with a thin film with eletro-optical properties, devices can be made for electric-optical transformation.

EXAMPLES

This invention will be further described with the reference to the accompanying examples. These examples are presented to illustrate ways of practicing the invention but are not to be construed as limitations to the claims.

Example 1

MSM devices were fabricated in the structure shown in FIG. 1. The anode electrode (11) used in this Example was an indium doped tin oxide (ITO) layer with work function close to 4.8 eV and surface resisitivity of ~20 Ω/square. A 7 mil Mylar film was used as the substrate (14) for this device. A thin layer of MEH-PPV (~1500 Å) was spin cast onto the ITO electrode at room temperature. Details on the synthesis and process of MEH-PPV can be found in literature [F. Wudl, P. M. Allemand, G. Srdanov, Z. Ni, and D. McBranch, in *Materials for Nonlinear Optics: Chemical Perspectives*, Ed. S. R. Marder, J. E. Sohn and G. D. Stucky (American Chemical Society, Washington, D.C., 1991) p. 683]. A thin layer of Ca (500–5000 Å) was then thermally evaporated as the cathode electrode (the Ca was typically over-covered by a protective layer Al). The active area of each device was 0.1 cm².

Figure 5A:
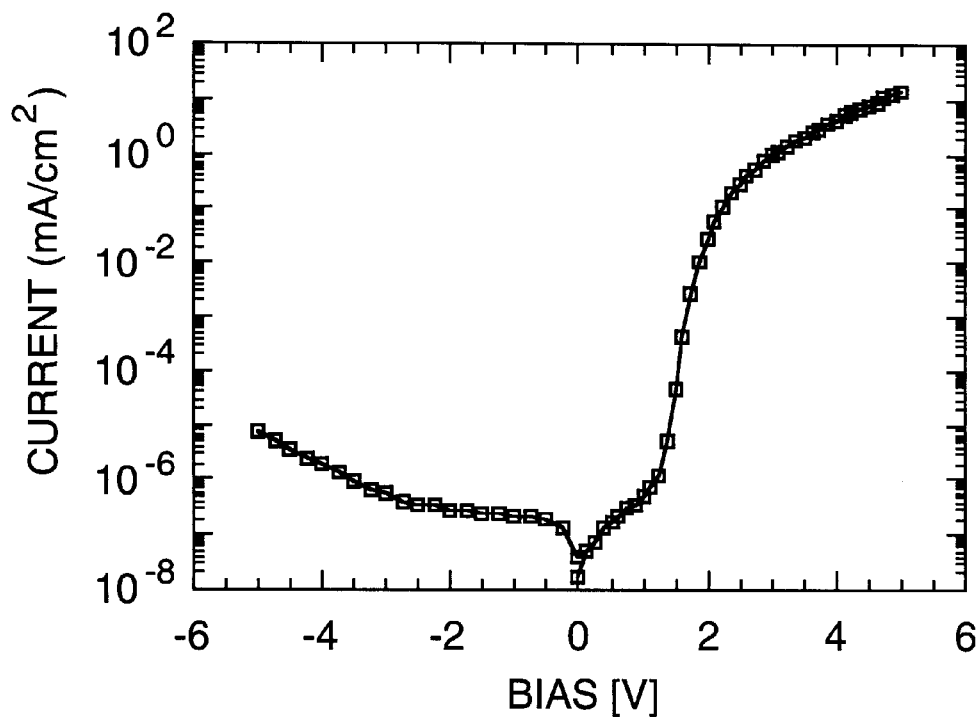
FIGS. 5A and 5B are a set of graphs which show the I-V characteristics (a) and rectification ratio, $R_r$ (b) of a microswitch made in the form of ITO/MEH-PPV/Ca.

FIG. 5A shows the device current as a function of bias voltage. Forward bias is defined as positive voltage applied to the ITO contact. The I-V characteristics in forward bias can be classified into three regions. A very small current was detected below 1.3 V (e.g. ~0.4 nA/cm² at 1V). In the range of 1.3–2 V, the forward current increased exponentially with the biasing voltage, by approximately five orders of magnitude. For V>2 V, the rate of increase of the forward current diminished; the forward current in the high bias region was dominated by both tunneling and space charge limited transport [D. Braun and A. J. Heeger, Appl. Phys. Lett. 58, 1982 (1991); I. D. Parker, J. Appl. Phys 75, 1656 (1994)].

Figure 5B:
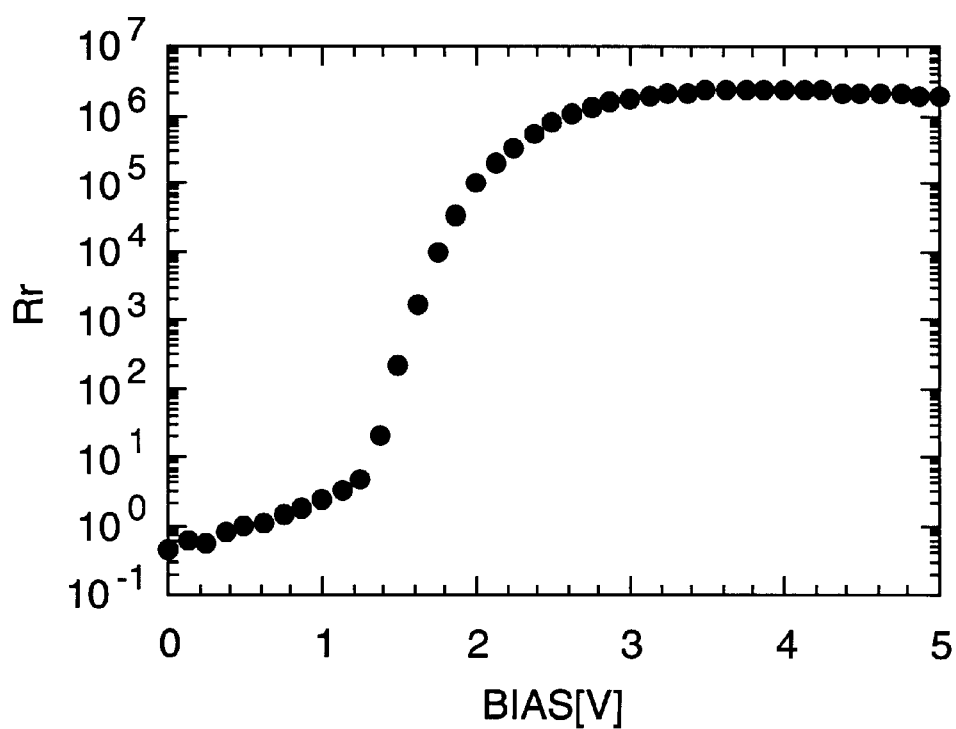

In reverse bias, the current remained nearly constant at the level of $10^{-11}$ A/cm² for several volts. The rectification ratio ($R_r$) of this device is plotted in FIG. 5B. $R_r$, ~$4\times10^6$ at 3 V.

MSM devices were also fabricated with P3HT, Alq3, PPV, and $C_{60}$ as the semiconducting layer. Similar device performances were observed.

MSM devices similar to that shown in FIG. 1 were also fabricated in 4.0 cm×6.4 cm size. Similar device performance was observed.

This example demonstrates that electric microswitches can be constructed in the thin film MSM configuration. These two-terminal, passive devices can be switched to the conductive state ("ON" state) by applying a forward bias (with higher potential on the anode electrode), and switched to the non-conducting state ("OFF" state) by applying a reverse bias or a zero bias. Rectification ratios higher than $10^6$ were demonstrated at 3 V. The ON/OFF switching ratio under I(5 V)/I(0V) is even higher, approaching approximately $10^9$ (see, FIG. 5A).

This Example also demonstrates that orgamic semiconductors can be used to fabricate microswitches at room temperature, using low cost processes (such as casting, ink-jet printing, screen printing, or thermal evaporation) applicable to fabrication of arrays over large areas.

Moreover, the microswitches demonstrated in this Example were fabricated on flexible mylar substrates and in flexible form. This mechanical flexibility is unique compared to commercialized active switching panels made with TFTs (the high temperature fabrication process processes prohibit the use of flexible substrates).

Example 2

Figure 6A:
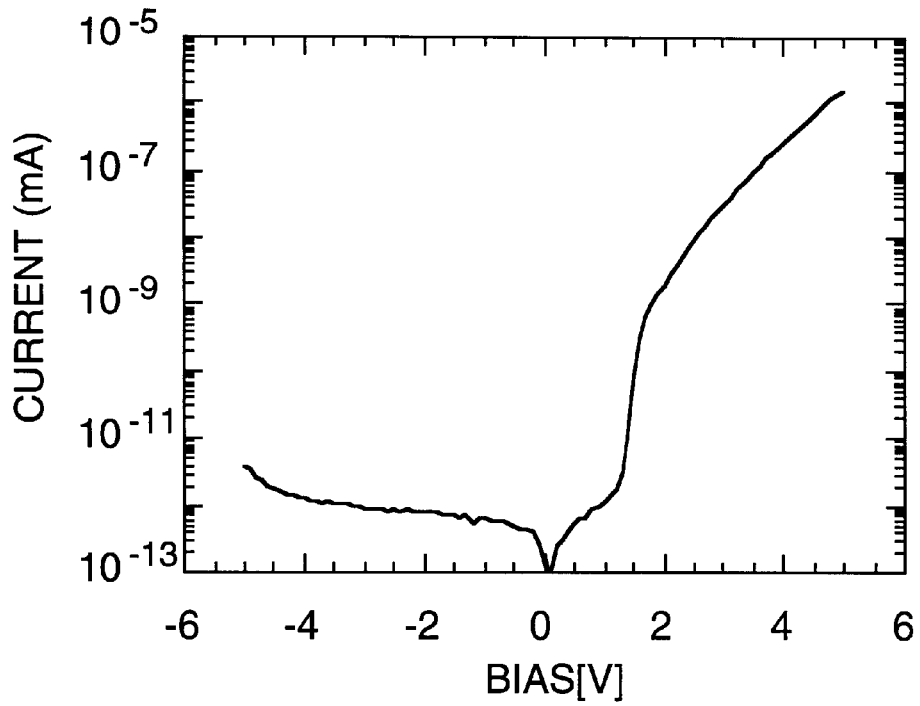
FIGS. 6A and 6B are a set of graphs which show the I-V characteristics (a) and rectification ratio, $R_r$ (b) of a microswitch made in the form of Au/MEH-PPV/Al.
Figure 6B:
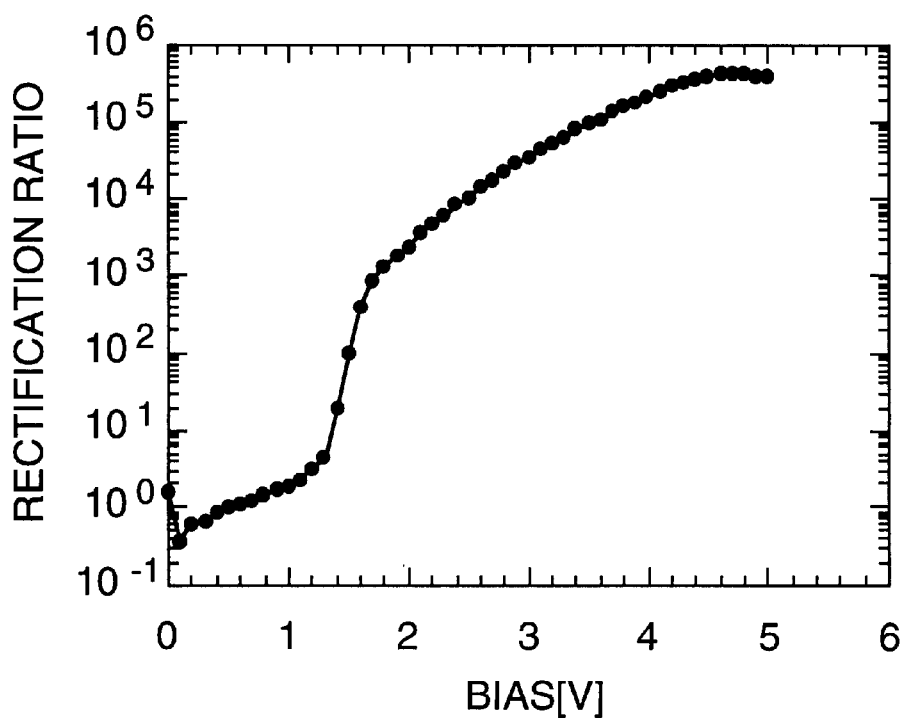

The experiments of Example 1 were repeated with Au as the anode and Al as the cathode. The device size was reduced to ~0.0004 cm², comparable to that of a pixel in a microswitch matrix for image sensor applications. The I-V characteristics and the rectification ratio are shown in FIGS. 6A and 6B. The rectification ratio and the ON/Off ratio at 5V and 0V were ~$5\times10^5$ and >$10^7$, respectively.

Similar devices were fabricated with different metal cathode, including Sm, Y, Pr, MgAg, MgAl, Li, Ba, Ag, Cu, In, Hf etc. Similar switching effect was observed in each case.

Similar devices were fabricated with a thin buffer inserting between the semiconducting layer and the cathode layer. Examples of the buffer layer include inorganic compounds such as LiF, BaO, BaF$_2$, Li$_2$O. Organic molecules can also be used for the buffer. Examples include OCA mad its derivatives. Similar switching effect was observed in each case.

Organic molecules were also used for the buffer. Examples include anionic surfactants such as ether sulfates with a common structure,

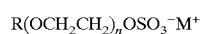

wherein R represents alkyl alkyllaryl,

M+ represents proton, metal or ammonium counterion,
n is moles of ethylene oxide typically n=2–40).

When a buffer layer comprising these organic molecules was placed between the Al cathode and the semiconducting MEH-PPV, improved device performance was observed.

Similar devices were fabricated with different metal anodes, including Au, Cr, Ag, Pt etc. Conducting polymers (such as PANI-CSA, PEDOT-PSS) were also used as the anode material. In each case, similar switching performance was observed. In the microswitches fabricated in the Au/MEH-PPV/Ca/Al configuration, a forward current of 200 A/cm$^2$ was achieved under pulsed operation. Comparing this value to the device current of $10^{-9}$ mA/cm$^2$ at ~zero bias, a switching ratio of >$10^{11}$ was demonstrated.

This example demonstrates that metals with work functions covering a broad range can be selected as the anode and cathode materials. This example also demonstrates that stable metals (such as Au, Ag, Al) and conducting polymers can be used as the electrode materials for the microswitches. This example also demonstrates that a buffer layer can be inserted between the semiconductor layer and the cathode layer.

Example 3

Figure 7A:
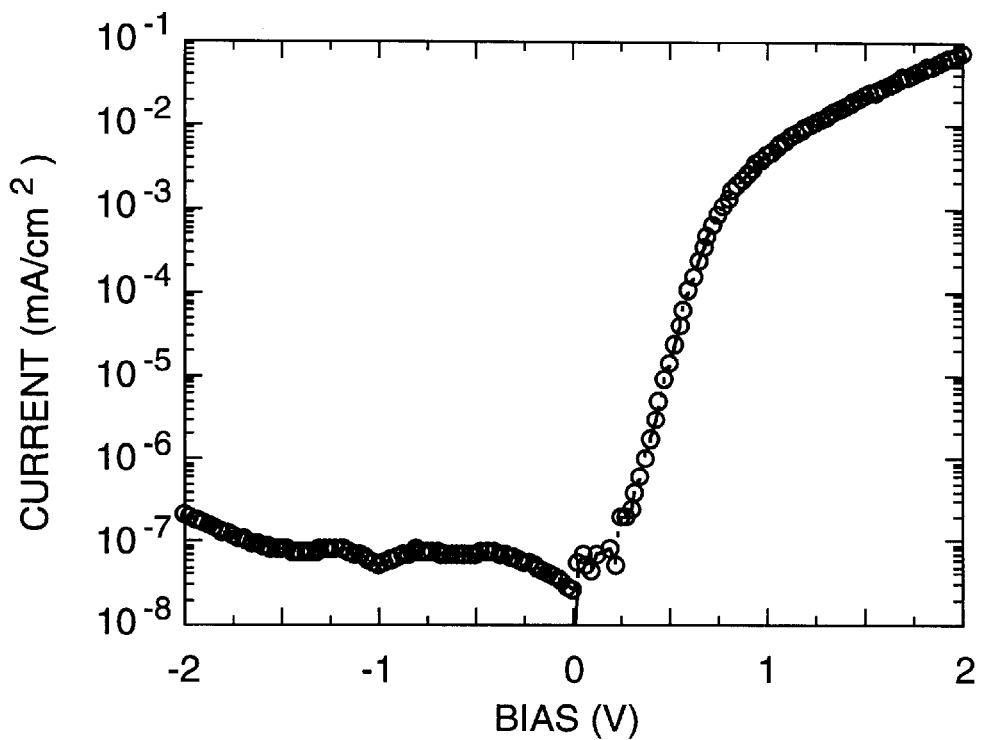
FIGS. 7A and 7B are a set of graphs which show the I-V characteristics (a) and rectification ratio, $R_r$ (b) of a microswitch made in the form of ITO/MEH-PPV:PCBM/Al.
Figure 7B:
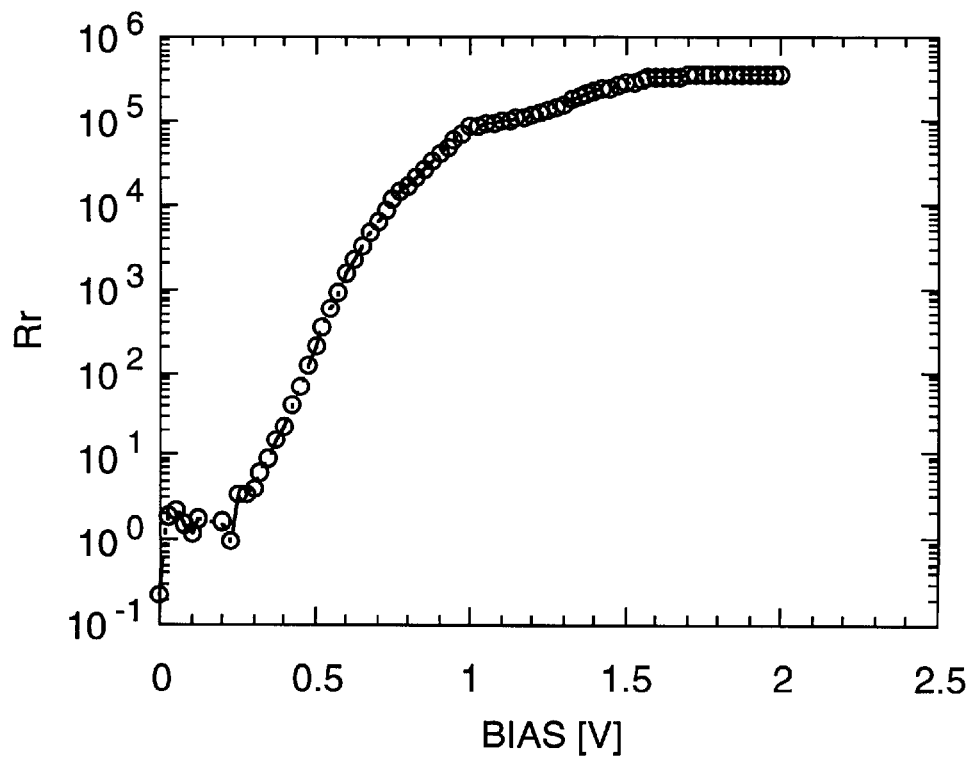

The experiments of Example 1 were repeated with ITO as the anode and Al as the cathode. An MeH-PPV:PCBM blend film (1:1 weight ratio) was used as the semiconducting layer 12, which was spin cast from solution in xylenes (concentration of approximately 0.5 wt %). PCBM is a fullerene molecule with molecular structure and chemical properties similar to C$_{60}$ (a form of C molecule in buckyball shape). Details about its synthesis and characterization has been documented in literature [J. C. Hummelen, B. W. Knight, F. Lepec, and F. Wudl, J. Org. Chem. 60, 532 (1995)]. The I-V characteristics and the rectification ratio are plotted in FIGS. 7A and 7B. The rectification ratio was larger than 4×10$^5$ for bias over 1.5 V and the ON/Off ratio operating at 2V and 0V was >3×10$^7$.

Similar results were obtained from ITO/IAEH-PPV/C$_6$d/Al, ITO/TPB/Alq3/Al devices in which the semiconducting layer was in a bi-layer structure reminiscent of the so-called heterojunction structure in inorganic devices.

This Example demonstrates that the semiconducting layer 12 in the microswitches can be a blend, a composite, a bi-layer or a multilayer structure. This Example also demonstrates that, due to the charge transfer effect between MEH-PPV and PCBM, the forward current turn-on voltage was significantly reduced, thereby achieving a high rectification ratio at relatively low bias.

Example 4

Figure 8A:
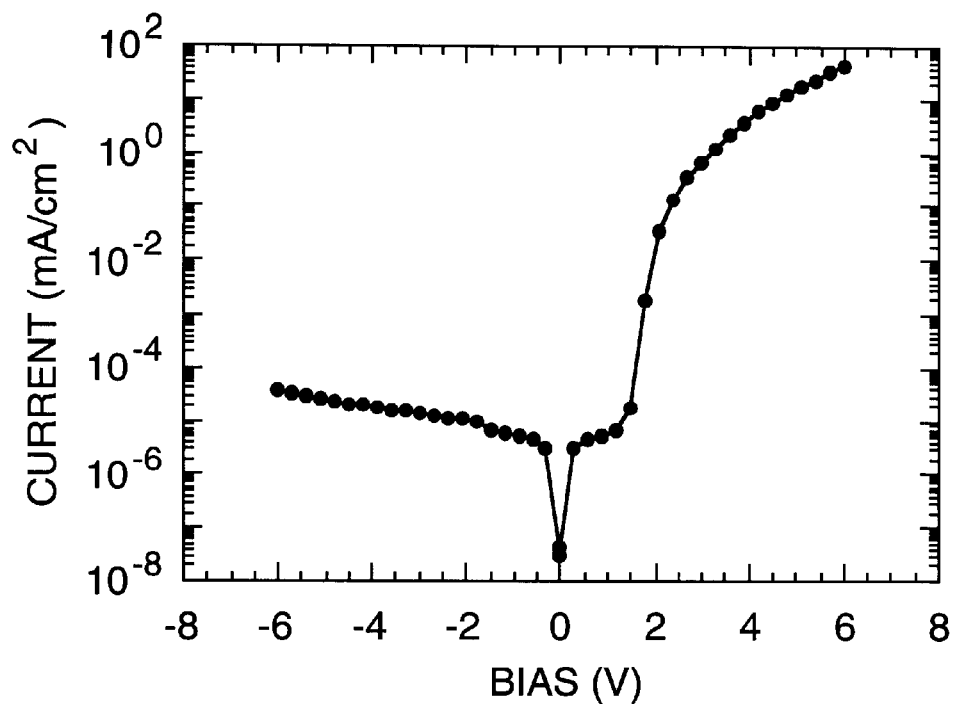
FIGS. 8A and 8B are a set of graphs which show the I-V characteristics (a) and rectification ratio, $R_r$ (b) of a microswitch made in the form of Ag/PANI-PAAMPSA/MEH-PPV/Ca.
Figure 8B:
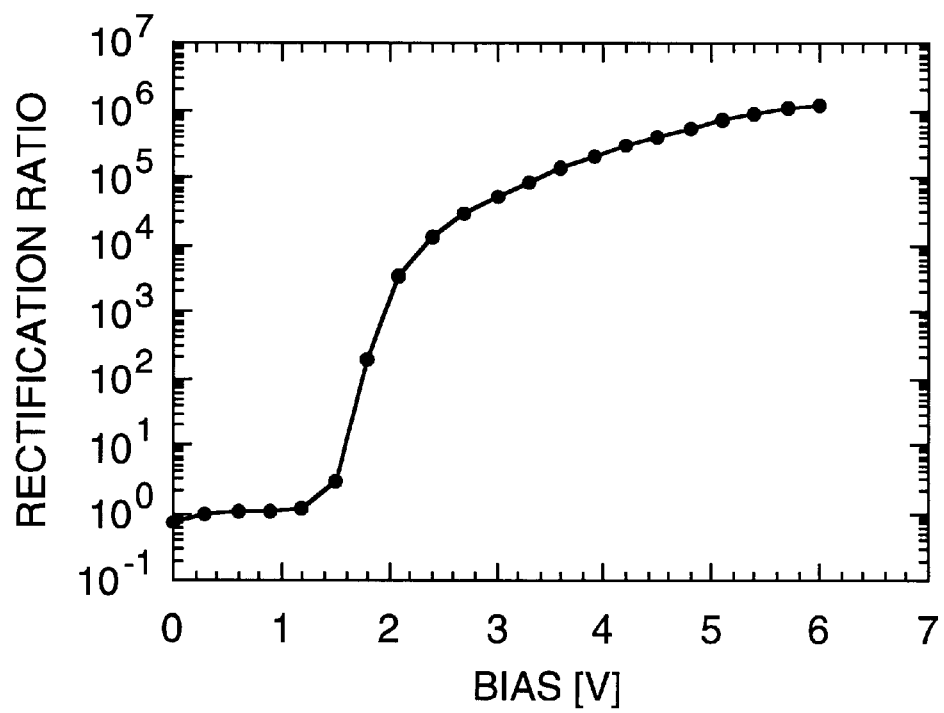

The experiments of Example 1 were repeated with Ag as the anode and Ca as the cathode. The device size was ~0.0014 cm$^2$, reminiscent of a 0.35 mm×0.4 mm pixel of a microswitch matrix. A PANI-PAAMPSA layer (300 Å) was inserted in between the Ag and the MEH-PPV layer as a buffer layer. The I-V characteristics and the rectification ratio are plotted in FIGS. 8A and 8B. The rectification ratio was higher than 10$^6$ at 6V. The ON/Off ratio at 6V and 0V was greater than 2×$^8$. The PANI layer also reduced the incidence of electrical shorts, thereby improving fabrication yield and device operating lifetime considerably.

This experiment was repeated with the thickness of the buffer layer varied between 100 and 3000 Å. Similar device performance was observed.

This experiment was repeated with a buffer layer made with PANI with different resistivity (from 10$^2$ S/cm to 10$^{-6}$ S/cm). The resistivity was varied either by choosing different counterions (such as CSA, PAAMPSA) or by blending the conductive PANI with an electrically-inert host polymer (such as PMMA). Similar device performance was observed.

This example demonstrated that a buffer layer can be inserted at the S-M interface to improve the device performance (such as reduction of device shorts, enhancement of device stability). The buffer layer can also be used to modify the M-S interface and thereby improve the device I-V characteristics. The current turn-on in this Example was determined by the work function of the PANI (~5 eV), rather than by the Ag (~4.3 eV) metal layer. This example also demonstrates that the resistivity of the buffer layer can be varied in a broad range.

Example 5

Devices were fabricated in the form of ITO/PANI-PAAMPSA/Au. Linear I-V characteristics were observed in both biasing directions. Ohmic contacts at both ITO/PANI-PAAMPSA and metal/PANI-PAAMPSA interfaces were explored.

This example along with the Example 4 demonstrate that a high resistive PANI layer can be used as the common electrode 23 and 33 (see FIG. 2 and FIG. 3) to serve both as the anode for the microswitch and the ohmic contact to the sensors 24 and 34.

Example 6

Figure 9A:
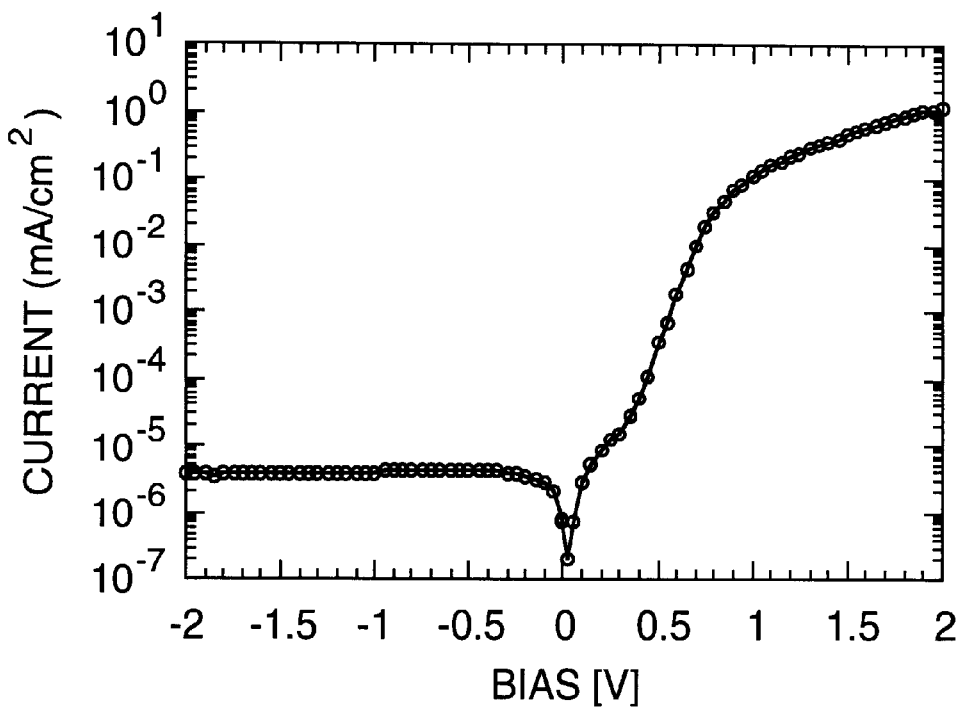
FIGS. 9A and 9B are a set of graphs which show the I-V characteristics (a) and rectification ratio, $R_r$ (b) of a microswitch made in the form of ITO/p-i-n/Al in which the semiconductor was amorphous silicon film.
Figure 9B:
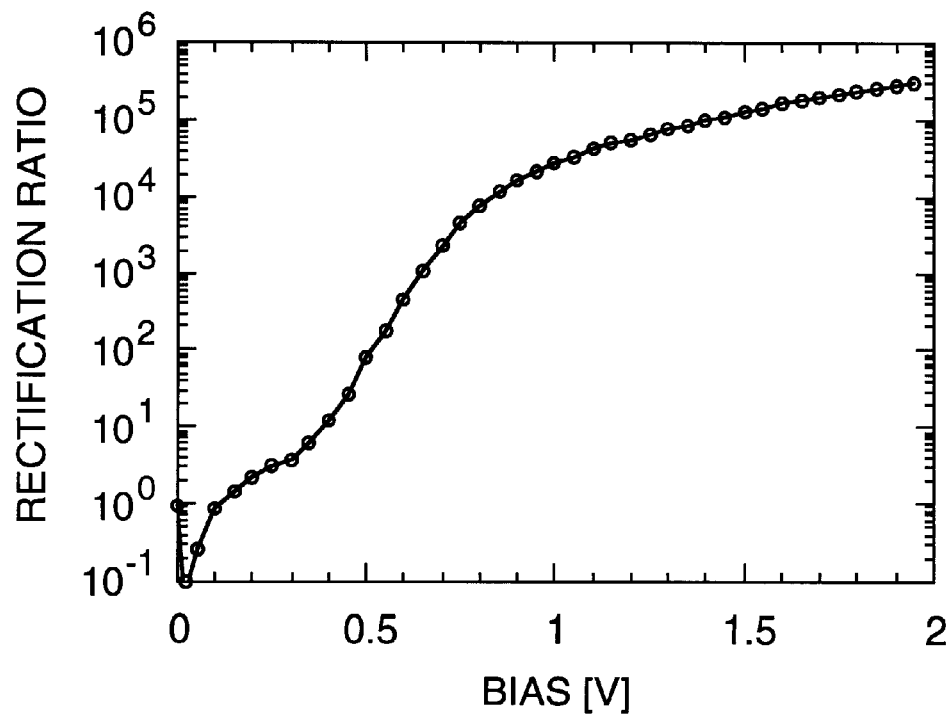

The experiments of Example 1 were repeated with ITO as the anode and Al as the cathode. An amorphous Si film was used as the semiconducting layer. The amorphous Si film was prepared by chemical vapor deposition, and was in p-type/undoped/n-type three layer configuration. The doping was achieved by ion implantation. The I-V characteristics and the rectification ratio are plotted in FIGS. 9A and 9B. The rectification ratio was ~3×10$^5$ at 2 V and the ON/Off ratio at 2V and ~0V was >5×10$^6$.

This example demonstrates that inorganic( semiconductor films can also be used as the semiconducting layer 12, 22, 32 in the microswitches of this invention.

Example 7

Figure 10A:
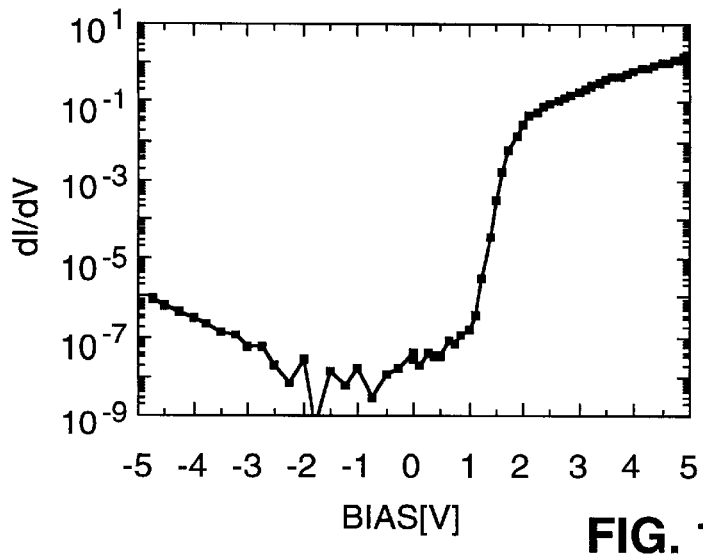
FIGS. 10A–10C are a set of graphs which show the characteristics of dI/dV–V (a), G–V (b), and current integration int IdV–V (c) of a microswitch made in the form of ITO/MEH-PPV/Ca.
Figure 10B:
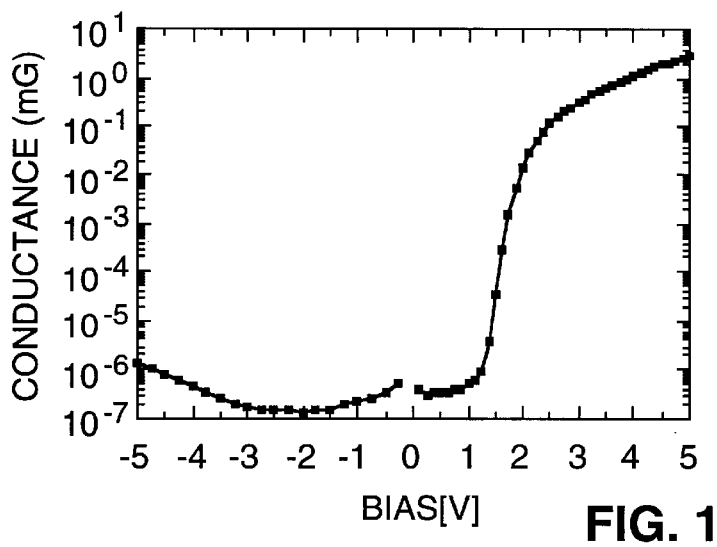
Figure 10C:
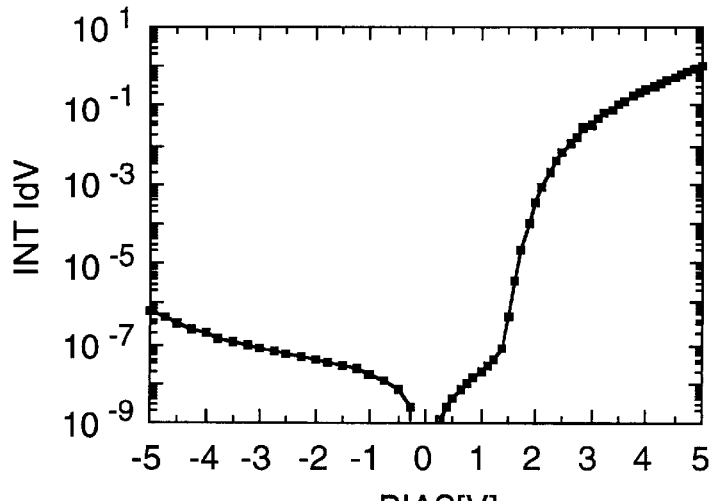

Microswitches were fabricated similar to that shown in Example 1. The device differential current dI/dV was measured as a function of biasing voltage; the data are shown in FIG. 10A. The device conductance G (=I/V) as a function of bias voltage was measured; the data are shown in FIG. 10B. The integrated current, Int_IdV, as a function of biasing voltage was measured and shown in FIG. 10C. Switching behavior similar to that of I-V (see FIG. 5A) were observed for all these quantities.

The time derivative and integral of the device current I were also tested, switching behavior identical to the device current I (FIG. 5A) were observed.

This example demonstrates that the microswitches 10 can not only be used for switching device current I, but also for switching other physical parameters related with the current (for example, the various derivatives and the integrals of the current).

Example 8

Figure 11:
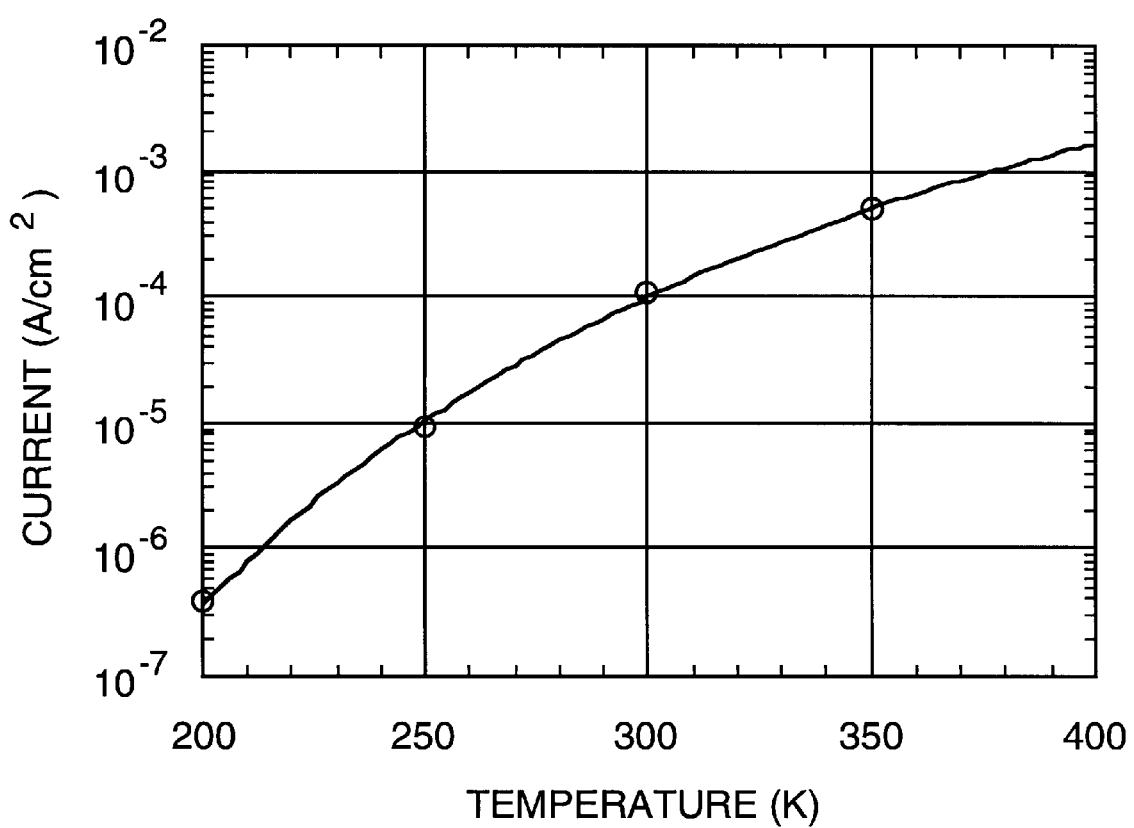
FIG. 11 shows current vs temperature characteristics of an ITO/MEH-PPV/Ca device in the temperature range between −73° C. and +127° C. (200K to 400K)

ITO/MEH-PPV/Ca microswitches were fabricated in the structure shown in FIG. 1. The thickness of the MEH-PPV was ~2000 Å. The device current at 3V was measured as a function of ambient temperature; the data are plotted in FIG. 11, which shows that the current follows the relation, $\exp(-T_0/T)$, with $T_0 \sim 0.34$ eV.

Figure 12A:
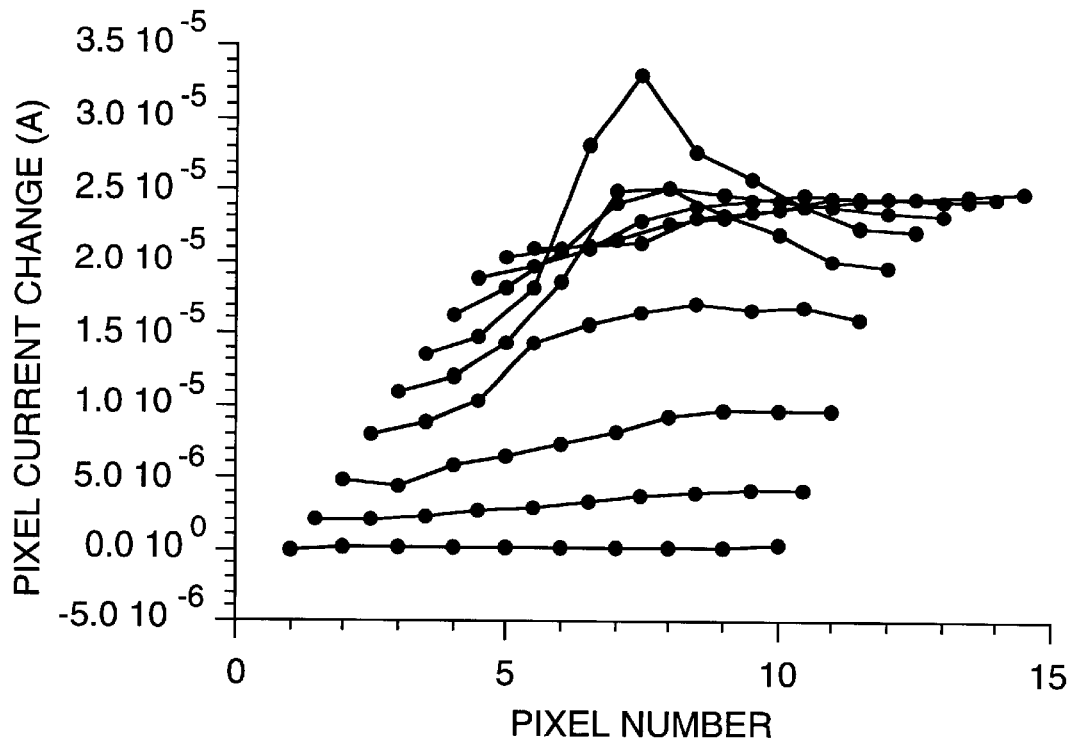
FIG. 12A and 12B show the current image (pixel current distribution) on a 10×10 temperature sensor matrix (a); and the corresponding temperature image from the same matrix (b).
Figure 12B:
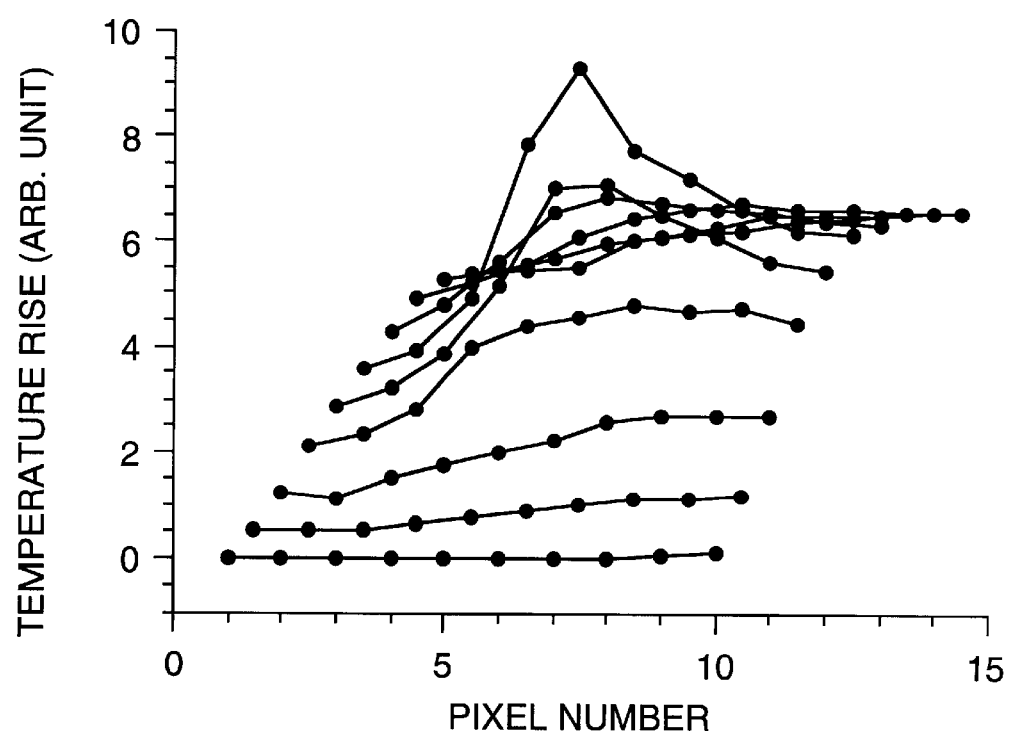

Microswitches in the same configuration were also fabricated in 10×10 column-row addressable matrix form similar to that shown in FIG. 3, but without layer 33 and 34. The pixel area was 0.35 mm×0.4 mm and the pitch size was 0.625×0.625 mm$^2$. The matrix was scanned with electric pulses between 0 and 3.0 V following the first driving scheme described in the Description of the Preferred Embodiments. A point heat source was placed on top of the pixel (5,5), which results in a temperature distribution on top of the 10×10 temperature sensor. The device current distribution and its corresponding surface temperature distribution are shown in FIG. 12.

This Example demonstrates that the microswitches 10 made with semiconducting films with proper thickness can be used as a temperature sensor. The forward current of the microswitches varies with temperature. Column-row addressable matrices fabricated with such microswitches can be used as a temperature sensor to image the temperature distribution over the device surface.

Example 9

A voltage switchable infrared sensor element was fabricated in the structure shown schematically in FIG. 2A. The device was fabricated on a glass substrate with films in the following order: ITO/MEH-PPV/Ca/Au/InSb/Au. Semitransparent Au (200 Å) was used as the electrode 25, which allowed infrared IR radiation to pass through and reach the IR sensor layer. A bi-layer metal (Ca/Au) was used as the common electrode 23.

In addition to its good rectifying I-V characteristics, the ITO/MEH-PPV/Ca device is also a good light emitting device with red-orange color. Since its emission intensity is proportional to the forward current passing through the device over a broad current range, the integrated device in this example serves as an infrared indicator. The output orange light intensity reflects the intensity of the infrared radiation.

This example demonstrates that voltage switchable IR sensors can be constructed by integrating a microswitch and a thin film IR sensor. When the integrated sensor is biased in forward direction, the device is switched-on with high photosensitivity. The same device at zero and reverse bias does not respond to the IR radiation. This switching characteristic makes the device an ideal element in the construction of x-y addressable, passive IR sensor matrices. When a visible light emitting diode is used as the microswitch, the integrated device (the matrix) functions as an IR indicator.

This example also demonstrates that by replacing the sensor layer with other materials, sensors and sensor matrices sensitive to radiation in other wavelengths of the electromagnetic spectrum (such as UV, X ray, far-infrared, microwave and radiowave) can be constructed. Sensors sensitive to magnetic field, to mechanical pressure and to acoustic waves can also be fabricated using this general principle.

Example 10

A voltage switchable X-ray sensor element was fabricated in the structure shown schematically in FIG. 2A. The device was fabricated on a glass substrate with films in the following order: ITO/MEH-PPV/Al/Se/Al. Selinium was used as the X-ray sensing layer, its electric characteristic under X-ray radiation has been disclosed in Physics Today, Nov. 1997. A thin Al layer (500 Å) was used as the electrode 25, which is transparent to X-ray radiation. Aluminum (2 μm) was used as the common electrode 23.

The X-ray radiation results in the current increase (following a linear relation) in the sensing layer 24 made with Selenium. The pixel resistance of the Al/Se/Al device is thus falls to the range of $10^3-10^8$ $\Omega/cm^2$ (dependent on radiation intensity) which is much larger than the forward resistance typically <1 $K\Omega/cm^2$ of the microswitch constructed by ITO/MEH-PPV/Al, but much smaller than the switch resistance at zero or reverse bias. The forward current of the integrated X-ray sensor element (ITO/MEH-PPV/Al/Se/Al) is thus reflecting the X-ray intensity, and the switching characteristics of the integrated device allows it to be used in fabrication of X-Y addressable X-ray sensing matrices as described in this invention.

This example demonstrates that voltage switchable X-ray sensors can be constructed by integrating a microswitch and a thin film X-ray sensor. When the integrated sensor element (pixel) is biased in forward direction, the pixel is switched-on, and the current strength is proportional to the intensity of the X-ray radiation. The same device at zero and reverse bias does not respond to the X-ray radiation. This switching characteristic makes such integrated devices ideal pixel elements for constructing x-y addressable, passive X-ray sensor matrices. When a visible light emitting diode is used as the microswitch (for instance, replacing the Al electrode 23 with Ca/Al bi-layer electrode), the integrated device shown in this example or a matrix of such integrated devices), the X-ray intensity can be reflected by the visible electroluminescent intensity of the microswitch, forming a X-ray indicator.

This example along with Example 9 also demonstrate that by placing a sensor layer in which its electric conductivity or its variations varies with environmental conditions, a variety of sensor devices (e.g., radiation sensors sensitive to a certain range of electromagnetic spectrum such as UV, X ray, far-infrared, microwave and radiowave) can be constructed. Sensors sensitive to magnetic field, to mechanical pressure and to acoustic waves can also be fabricated using this general principle.

Example 11

Microswitches were fabricated in the form of Au/MEH-PPV/Ca/Al on glass substrates. The thickness of the Ca layer is varied between 1 nm to 1000 nm. Lateral resistance (resistance in parallel to the substrate surface) measurement of the bare Ca film on a glass substrate revealed the Ca film forms discontinuous particle for thickness below approximate 10 nm (the detail threshold is related to the surface roughness of the substrate). The I-V performance of the microswitches with Ca thickness less than 10 nm is similar to that with Ca film of thickness larger than 10 nm, which is determined by the work function of the Ca, rather than that of Al.

This example suggests that a thin metal layer in laterally-discontinuous granular form can be used as the electrode material to define the I-V performance of the microswitch. Such metal layers provide novel thin films of high conductivity in vertical direction and insulating in lateral direction. They are useful in fabrication contact layer 23, 33 (the common electrode of the sensor and the microswitch) without patterning.

What is claimed is:

1. A microswitch array comprising a plurality of electric microswitches, each member of the plurality of microswitches being in first electrode/semiconductor/second electrode layer form with the semiconductor layer being a unit body shared by the members of the array, wherein each of the electric microswitches has an I-V characteristic with an asymmetric shape as shown in FIGS. 5A, 6A, 7A, 8A, 9A, 10A, 10B or 10C.

2. The microswitch array of claim 1 wherein the plurality of microswitches are configured in an x-y-addressable array.

3. The microswitch array of claim 1 wherein the semiconductor is an inorganic semiconductor.

4. The microswitch array of claim 1 wherein the semiconductor is an organic semiconductor.

5. The microswitch array of claim 2 wherein the semiconductor is an organic semiconductor.

6. The microswitch array of claim 4 wherein the organic semiconductor is selected from the group consisting of conjugated organic semiconducting polymers, conjugated organic semiconducting polymer blends, semiconducting organic molecules, semiconducting organometallic molecules, molecular blends or semiconducting organic molecules and multilayer structures of such materials.

7. The microswitch array of claim 1 wherein at least one of the electrodes is a metallic electrode.

8. The microswitch array of claim 1 wherein at least one of the electrodes comprises a conductive organic polymer.

9. The microswitch array of claim 1 wherein at least one of the electrodes comprises a buffer layer adjacent to the semiconductor layer.

10. The microswitch array of claim 1 wherein at least one of the electrodes is transparent.

11. A three dimensional microswitch array comprising a stack of a plurality of the arrays of claim 1.

12. A three dimensional microswitch array comprising a stack of a plurality of the arrays of claim 2.

13. A multi-element voltage-switchable sensor array comprising a microswitch array comprising a plurality of electric microswitches, each member of the plurality of microswitches being in first electrode/semiconductor/second electrode layer form with the semiconductor layer being a unit body shared by the members of the array, with individual elements of the array connected in series with individual members of a plurality of sensor elements, said sensor elements producing an electrical signal in response to a stimulus being sensed.

14. The multi-element voltage-switchable sensor array of claim 13 wherein the sensors are thin layer sensors, themselves being in first sensor electrode/sensor semiconductor/second sensor electrode layer form.

15. The multi-element voltage-switchable sensor array of claim 14 wherein the sensor semiconductor is an organic semiconductor.

16. The multi-element voltage-switchable sensor array of claim 15 wherein the microswitch and the sensor share a common electrode.

17. A multi-element voltage-switchable sensor array comprising a microswitch array of claim 5 with individual elements of the array connected in series with individual members of a plurality of sensor elements, said sensor elements producing an electrical signal in response to a stimulus being sensed.

18. The multi-element voltage-switchable sensor array of claim 17 wherein the sensors are thin layer sensors, themselves being in first sensor electrode/sensor semiconductor/second sensor electrode layer form.

19. The multi-element voltage-switchable sensor array of claim 18 wherein the sensor semiconductor is an organic semiconductor.

20. The multi-element voltage-switchable sensor array of claim 19 wherein the microswitch and the sensor share a common electrode.

21. The multi-element voltage-switchable sensor array of claim 15 additionally comprising a supporting substrate.

22. The multi-element voltage-switchable sensor array of claim 15 wherein the sensor senses light.

23. The multi-element voltage-switchable sensor array of claim 22 wherein the second sensor electrode is transparent to the light being sensed.

24. The multi-element voltage-switchable sensor array of claim 22 wherein the light comprises visible light.

25. The multi-element voltage-switchable sensor array of claim 22 wherein the light comprises ultraviolet light.

26. The multi-element voltage-switchable sensor array of claim 22 wherein the light comprises infrared light.

27. The multi-element voltage-switchable sensor array of claim 15 wherein the sensor senses X-rays.

28. The multi-element voltage-switchable sensor array of claim 15 wherein the sensor senses ionized high energy particles selected from electrons, beta particles and gamma ray radiation.

29. The multi-element voltage-switchable sensor array of claim 15 wherein the sensor senses surface pressure.

30. The multi-element voltage-switchable sensor array of claim 15 wherein the sensor senses surface temperature.

31. The multi-element voltage-switchable sensor array of claim 13 made in two dimensional x-y addressable form.

32. A plurality of sensor arrays of claim 13 stacked to form a three dimensional matrix.

33. A plurality of sensor arrays of claim 13 stacked to form an integrated sensor array with multiple sensing functions.

* * * * *